(12) United States Patent
Matsuoka et al.

(10) Patent No.: US 8,419,299 B2
(45) Date of Patent: Apr. 16, 2013

(54) COATING AND DEVELOPING APPARATUS AND METHOD, AND STORAGE MEDIUM

(75) Inventors: Nobuaki Matsuoka, Koshi (JP); Akira Miyata, Koshi (JP); Shinichi Hayashi, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 59 days.

(21) Appl. No.: 13/219,955

(22) Filed: Aug. 29, 2011

(65) Prior Publication Data
US 2012/0057861 A1 Mar. 8, 2012

(30) Foreign Application Priority Data
Sep. 2, 2010 (JP) ................... 2010-197036

(51) Int. Cl.
*G03D 5/00* (2006.01)
(52) U.S. Cl.
USPC .............................. 396/611; 355/27; 118/66
(58) Field of Classification Search .................. 396/611; 355/27; 118/52, 66; 700/121
See application file for complete search history.

(56) References Cited

U.S. PATENT DOCUMENTS

| | | | | |
|---|---|---|---|---|
| 6,299,363 | B1 * | 10/2001 | Ueda ............................ | 396/611 |
| 7,661,894 | B2 | 2/2010 | Matsuoka et al. | |
| 7,836,845 | B2 * | 11/2010 | Tanoue et al. ................ | 118/500 |
| 2012/0008936 | A1 * | 1/2012 | Matsuoka et al. ............ | 396/611 |

FOREIGN PATENT DOCUMENTS
JP 2007-115831 A1 5/2007

* cited by examiner

*Primary Examiner* — Christopher Mahoey
(74) *Attorney, Agent, or Firm* — Burr & Brown

(57) ABSTRACT

In one embodiment, a coating and developing apparatus is provided with a processing block including a liquid processing block disposed on the carrier block side and a heating processing block disposed on the interface block side. The liquid processing block includes a first unit block, a second unit block, and one or more of developing unit blocks overlying or underlying a stack of the first unit block and the second unit block. The first unit block includes antireflection film-forming modules and resist film-forming modules disposed on both sides of the transport passage thereof. The second unit block includes upper film-forming modules and hardening modules disposed on both sides of the transport passage thereof.

23 Claims, 28 Drawing Sheets

COATING AND DEVELOPING APPARATUS AND METHOD, AND STORAGE MEDIUM

CROSS-REFERENCE TO RELATED APPLICATION

This application is based on and claims the benefit of priority to Japanese Patent Application No. 2010-197036 filed on Sep. 2, 2010, the entire contents of which are incorporated herein by reference.

TECHNICAL FIELD

The present disclosure relates to a coating and developing apparatus, a coating and developing method and a storage medium for applying a resist to a substrate and developing the resist after exposure.

BACKGROUND ART

A semiconductor manufacturing process includes a photolithography process comprising applying a photoresist (hereinafter simply referred to as a resist) to a surface of a semiconductor wafer (hereinafter simply referred to as a wafer), exposing the resist in a predetermined pattern, and developing the exposed resist to form a resist pattern. A coating and developing apparatus for forming such a resist pattern includes a processing block having processing modules for performing various types of processing of a wafer.

The processing block is comprised of a stack of unit blocks for forming various types of coating films (e.g. resist film) and unit blocks for performing developing processing, as described e.g. in Japanese Patent Laid-Open Publication No. 2007-115831 (JP2007115831A). Each unit block has therein a wafer transport mechanism, by which a wafer is transported to various processing modules provided in each unit block, in which the wafer undergoes processing in the processing modules according to a predetermined order.

In order to meet recent demands for finer resist patterns, processing modules provided in a processing block are becoming diversified. For example, besides a resist film-forming module for applying a resist onto a wafer and a developing module for supplying a developer to the wafer, a processing block may also be provide with a hardening liquid supplying module for hardening a patterned resist film to allow repetitive photolithography process, and an upper protective film-forming module for forming a protective film for immersion exposure. With an increased number of diverse processing modules provided in a processing block of a coating and developing apparatus, there is a problem of how to reduce the increase in the footprint of the apparatus.

In the coating and developing apparatus disclosed in JP2007-115831A, the wafers are transported sequentially among the modules in the unit blocks. Thus, if one of the processing modules fails, the wafers can no longer be transported to the processing module for the later-stage processing. This significantly may lower the operation efficiency of the apparatus.

SUMMARY OF DISCLOSURE

The present disclosure provides a technique which can reduce the lowering of the throughput of a coating and developing apparatus, and enables small installation area of a processing block.

In one embodiment, there is provided a coating and developing apparatus comprising a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing block comprising a stack of a liquid processing unit blocks; (b) the liquid processing unit blocks includes a first unit block, a second unit block and one or more of developing unit blocks, said one or more developing unit blocks overlying or underlying a stack of the first unit block and the second unit block, the second unit block overlying the first unit block; (c, d) said coating and developing apparatus has one of a combination of the features (c1) and (d1) or a combination of the features (c2) and (d2): (c1) the first unit block includes: a transport passage extending linearly from the carrier block side to the interface block side; antireflection film-forming modules disposed on both sides of the transport passage each for supplying a chemical liquid onto the substrate to form thereon an antireflection film; resist film-forming modules disposed on both sides of the transport passage each for supplying a chemical liquid, comprising a resist liquid, onto the antireflection film to form a resist film on the antireflection film; a main transfer mechanism that moves along the transport passage to transport the substrate to and from the antireflection film-forming modules and the resist film-forming modules; (d1) the second unit block includes: a transport passage extending linearly from the carrier block side to the interface block side; upper film-forming modules disposed on both sides of the transport passage each for supplying a chemical liquid onto the resist film to form an upper film on the substrate; hardening modules disposed on both sides of the transport passage each for supplying a hardening liquid onto a patterned resist film, having been exposed and developed, to harden the patterned resist film; and a main transfer mechanism that moves along the transport passage to transport the substrate to and from the upper film-forming modules and the hardening modules; (c2) the first unit block includes: a transport passage extending linearly from the carrier block side to the interface block side; antireflection film-forming modules disposed on both sides of the transport passage each for supplying a chemical liquid onto the substrate to form thereon an antireflection film; hardening modules disposed on both sides of the transport passage each for supplying a hardening liquid onto a patterned resist film, having been exposed and developed, to harden the patterned resist film; a main transfer mechanism that moves along the transport passage to transport the substrate to and from the antireflection film-forming modules and the hardening modules; (d2) the second unit block includes: a transport passage extending linearly from the carrier block side to the interface block side; upper film-forming modules disposed on both sides of the transport passage each for supplying a chemical liquid onto the resist film to form an upper film on the substrate; resist film-forming modules disposed on both sides of the transport passage each for supplying a chemical liquid, comprising a resist liquid, onto the antireflection film to form a resist film on the antireflection film; and a main transfer mechanism that moves along the transport passage to transport the substrate to and from the upper film-forming modules and the resist film-forming modules; (e)

each of said one or more developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules; (f) the heating processing block includes: a stack of heating modules including first heating modules assigned to the first and second unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules; (g) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block; (h) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block; and (i) a transfer mechanism is provided to transfer a substrate, removed from a carrier placed in the carrier block, to the transfer stage on the carrier block side associated with the first unit block, and receive a substrate from the transfer stage on the carrier block side associated with each of said one or more developing unit blocks.

In another embodiment, there is provided a coating and developing apparatus comprising a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing, block comprising a stack of a liquid processing unit blocks; (b) the liquid processing unit blocks includes a first unit block, a second unit block and one or more developing unit blocks, said one or more developing unit blocks overlying or underlying a stack of the first unit block and the second unit block, the second unit block overlying the first unit block; (c) the first unit block includes: a transport passage extending linearly from the carrier block side to the interface block side; antireflection film-forming modules disposed on both sides of the transport passage each for supplying a chemical liquid onto the substrate to form thereon an antireflection film; and a main transfer mechanism that moves along the transport passage to transport the substrate to and from the antireflection film-forming modules; (d) the second unit block includes: a transport passage extending linearly from the carrier block side to the interface block side; upper film forming modules disposed on both sides of the transport passage each for supplying a chemical liquid onto a resist film to form an upper film on the substrate; and a main transfer mechanism that moves along the transport passage to transport the substrate to and from the upper film-forming modules; (e) one of the first and second unit blocks includes resist film-forming modules disposed on both sides of the transport passage of the first or second unit block each for supplying a chemical liquid, comprising a resist liquid, onto the antireflection film to form a resist film on the antireflection film; (f) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules; (g) the heating processing block includes: a stack of heating modules including first heating modules assigned to the first and second unit blocks to heat a substrate after being supplied with the chemical liquid, and second heating modules assigned to said one or more the developing unit blocks to heat a substrate before being supplied with a developer; and a vertical transport mechanism for transporting a substrate among the heating modules; (h) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block; (i) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block; (j) a transfer mechanism is provided to transfer a substrate, removed from a carrier placed in the carrier block, to the transfer stage on the carrier block side associated with the first unit block, and receive a substrate from the transfer stage on the carrier block side associated with the developing unit block; and (k) the developing modules included in said one or more developing unit blocks include positive resist-developing modules for developing a positive resist and negative resist-developing modules for developing a negative resist.

The coating and developing apparatus may be configured such that, said coating and developing apparatus includes two developing unit blocks, one being a positive resist-developing unit block exclusively for developing a positive resist and having the positive resist-developing modules disposed on both sides of the associated transport passage, and the other being a negative resist-developing unit block exclusively for developing a negative resist having the negative resist-developing modules disposed on both sides of the associated transport passage.

The coating and developing apparatus may be configured such that, each of said one or more developing unit blocks includes at least two positive resist-developing modules and at least two negative resist-developing modules. In this case, in each of said one or more developing unit blocks, the two positive resist-developing modules may be arranged on both sides of the transfer passage, and the two negative resist-developing modules may be arranged on both sides of the transfer passage. Alternatively, in each of said one or more developing unit blocks, the two positive resist-developing modules may be arranged side by side on one side of the transfer passage, and the two negative resist-developing modules may be arranged side by side on another side of the transfer passage.

In yet another embodiment, there is provided a coating and developing apparatus comprising a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing block comprising a stack of a liquid processing unit blocks; (b) the liquid processing unit blocks include a stack of film-forming unit blocks comprising an antireflection film-forming unit block for forming an antireflection film on a substrate, a resist film-forming unit block for forming a resist film on the antireflection film and an upper film-forming unit block for forming an upper film on the resist film, which are stacked from bottom up in that order; and the liquid processing unit blocks further includes one or more developing unit blocks, for developing an exposed substrate, overlying or underlying a stack of the film-forming unit blocks; (c) each of the liquid processing unit blocks includes: a transport passage extending linearly from the carrier block side to the interface block side; liquid processing modules disposed on both sides of the transport passage for supplying a chemical liquid onto the substrate to form thereon the antireflection film, the resist film or the upper film; a main transfer mechanism that moves along the transport passage to transport the substrate to and from the liquid processing modules; (d) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules; (e) the heating processing block includes: a stack of heating modules including first heating modules assigned to the film forming unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules; (f) a transfer stage is provided on the interface block side of each of the film forming unit blocks for transferring a substrate coated with the chemical liquid in the film-forming unit block from the main transfer mechanism of the film-forming unit block to the vertical transport mechanism; and a transfer stage is provided on the interface block side of the developing unit block for transferring an exposed substrate from the vertical transport mechanism to the main transfer mechanism of the developing unit block; (g) a transfer stage is provided on the carrier block side of each of said one or more developing unit blocks for receiving a developed substrate from the main transfer mechanism of the developing unit block; a transfer stage is provided on the carrier block side of the antireflection film-forming unit block for transferring a substrate, removed from the carrier, to the main transfer mechanism of the antireflection film-forming unit block; (h) a transfer mechanism is provided to transfer a substrate, removed from a carrier placed in the carrier block, to the transfer stage on the carrier block side associated with the antireflection film-forming unit block, and receive a substrate from the transfer stage on the carrier block side associated with said one or more developing unit blocks; and (i) said coating and developing apparatus further includes one of the following configurations (i-1), (i-2) and (i-3): (i-1) said coating and developing apparatus includes hardening modules to harden a resist pattern; all the developing modules included in said coating and developing apparatus are positive resist developing modules for developing a positive resist; the hardening modules are provided in one of the liquid processing unit blocks other than said one or more developing unit blocks; and the hardening modules are disposed on both sides of the transport passage of said one liquid processing unit; (i-2) said coating and developing apparatus includes hardening modules to harden a resist pattern; the hardening modules are provided in one of the liquid processing unit blocks other than said one or more developing unit blocks; and the developing modules included in said one or more developing unit blocks include positive resist-developing modules for developing a positive resist and negative resist-developing modules for developing a negative resist; (i-3) said coating and developing apparatus fails to include hardening modules; the developing modules include negative resist developing modules for developing a negative resist.

In yet another embodiment, there is provided a coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing block comprising a stack of a liquid processing unit blocks; (b) the liquid processing unit blocks includes a first unit block, a second unit block and one or more of developing unit blocks, said one or more developing unit blocks overlying or underlying a stack of the first unit block and the second unit block, the second unit block overlying the first unit block; (c, d) said coating and developing apparatus has one of a combination of the features (c1) and (d1) or a combination of the features (c2) and (d2): (c1) the first unit block includes: a transport passage extending linearly from the carrier block side to the interface block side; antireflection film-forming modules disposed on both sides of the transport passage each for supplying a chemical liquid onto the substrate to form thereon an antireflection film; resist film-forming modules disposed on both sides of the transport passage each for supplying a chemical liquid, comprising a resist liquid, onto the antireflection film to form a resist film on the antireflection film; a main transfer mechanism that moves along the transport passage to transport the substrate to and from the antireflection film-forming modules and the resist film-forming modules; (d1) the second unit block includes: a transport passage extending linearly from the carrier block side to the interface block side; upper film-forming modules disposed on both sides of the transport passage each for supplying a chemical liquid onto the resist film to form an upper film on the substrate; hardening modules disposed on both sides of the transport passage each for supplying a hardening liquid onto a patterned resist film, having been exposed and developed, to harden the patterned resist film; and a main transfer mechanism that moves along the transport passage to transport the substrate to and from the upper film-forming modules and the hardening modules; (c2) the first unit block includes: a transport passage extending linearly from the carrier block side to the interface block side; antireflection film-forming modules disposed on both sides of the transport passage each for supplying a chemical liquid onto the substrate to form thereon an antireflection film; hardening modules disposed on both sides of the transport passage each for supplying a hardening liquid onto a patterned resist film, having been exposed and developed, to harden the patterned resist film; a main transfer mechanism that moves along the transport passage to transport the substrate to and from the antireflection film-forming modules and the hardening modules; (d2) the second unit block includes: a transport passage extending linearly from the carrier block side to the interface block side; upper film-forming modules disposed on both sides of the transport passage each for supplying a chemical liquid onto the resist film to form an upper film on the substrate; resist film-forming modules disposed on both sides of the transport passage each for supplying a chemical liquid, comprising a resist liquid, onto the antireflection film to form a resist film on the antireflection film; and a main transfer mechanism that moves along the transport passage to transport the substrate to and from the upper film-forming modules and the resist film-forming modules; (e) each of said one or more developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules; (f) the heating processing block includes: a stack of heating modules including first heating modules assigned to the first and second unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules; (g) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block; (h) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block; and (i) a transfer mechanism is provided to transfer a substrate, removed from a carrier placed in the carrier block, to the transfer stage on the carrier block side associated with the first unit block, and receive a substrate from the transfer stage on the carrier block side associated with each of said one or more developing unit blocks, said coating and developing method comprising: supplying a resist liquid to a substrate to form a first resist film; thereafter developing the substrate to provide a first pattern to the first resist film; thereafter supplying a hardening liquid to the first resist film having the first pattern to harden it; thereafter supplying a resist liquid to a substrate to form a second resist film on the first resist film having the first pattern; and thereafter developing the substrate to provide a second pattern to the second resist film.

In yet another embodiment, there is provided a coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing block comprising a stack of a liquid processing unit blocks; (b) the liquid processing unit blocks includes a first unit block, a second unit block and one or more developing unit blocks, said one or more developing unit blocks overlying or underlying a stack of the first unit block and the second unit block, the second unit block overlying the first unit block; (c) the first unit block includes: a transport passage extending linearly from the carrier block side to the interface block side; antireflection film-forming modules disposed on both sides of the transport passage each for supplying a chemical liquid onto the substrate to form thereon an antireflection film; and a main transfer mechanism that moves along the transport passage to transport the substrate to and from the antireflection film-forming modules; (d) the second unit block includes: a transport passage extending linearly from the carrier block side to the interface block side; upper film forming modules disposed on both sides of the transport passage each for supplying a chemical liquid onto a resist film to form an upper film on the substrate; and a main transfer mechanism that moves along the transport passage to transport the substrate to and from the upper film-forming modules; (e) one of the first and second unit blocks includes resist film-forming modules disposed on both sides of the transport passage of the first or second unit block each for supplying a chemical liquid, comprising a resist liquid, onto the antireflection film to form a resist film on the antireflection film; (f) each of said one or more the developing unit blocks includes: a transport passage extending linearly from the carrier block side to the interface block side; developing modules disposed on both sides of the transport passage each for supplying developer to a substrate;

and a main transfer mechanism that moves along the transport passage to transport the substrate to and from the developing modules; (g) the heating processing block includes: a stack of heating modules including first heating modules assigned to the first and second unit blocks to heat a substrate after being supplied with the chemical liquid, and second heating modules assigned to said one or more the developing unit blocks to heat a substrate before being supplied with a developer; and a vertical transport mechanism for transporting a substrate among the heating modules; (h) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block; (i) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block; (j) a transfer mechanism is provided to transfer a substrate, removed from a carrier placed in the carrier block, to the transfer stage on the carrier block side associated with the first unit block, and receive a substrate from the transfer stage on the carrier block side associated with the developing unit block; and (k) the developing modules included in said one or more developing unit blocks include positive resist-developing modules for developing a positive resist and negative resist-developing modules for developing a negative resist, said coating and developing method comprising: applying a positive resist or a negative resist on a substrate by using one of the resist film-forming modules; and transporting the substrate to one of the positive resist-developing modules if the positive resist is applied to the substrate, or to one of the negative resist-developing modules if the negative resist is applied to the substrate.

In yet another embodiment, there is provided a coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing block comprising a stack of a liquid processing unit blocks; (b) the liquid processing unit blocks include a stack of film-forming unit blocks comprising an antireflection film-forming unit block for forming an antireflection film on a substrate, a resist film-forming unit block for forming a resist film on the antireflection film and an upper film-forming unit block for forming an upper film on the resist film, which are stacked from bottom up in that order; and the liquid processing unit blocks further includes one or more developing unit blocks, for developing an exposed substrate, overlying or underlying a stack of the film-forming unit blocks; (c) each of the liquid processing unit blocks includes: a transport passage extending linearly from the carrier block side to the interface block side; liquid processing modules disposed on both sides of the transport passage for supplying a chemical liquid onto the substrate to form thereon the antireflection film, the resist film or the upper film; a main transfer mechanism that moves along the transport passage to transport the substrate to and from the liquid processing modules; (d) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules; (e) the heating processing block includes: a stack of heating modules including first heating modules assigned to the film forming unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules; (f) a transfer stage is provided on the interface block side of each of the film forming unit blocks for transferring a substrate coated with the chemical liquid in the film-forming unit block from the main transfer mechanism of the film-forming unit block to the vertical transport mechanism; and a transfer stage is provided on the interface block side of the developing unit block for transferring an exposed substrate from the vertical transport mechanism to the main transfer mechanism of the developing unit block; (g) a transfer stage is provided on the carrier block side of each of said one or more developing unit blocks for receiving a developed substrate from the main transfer mechanism of the developing unit block; a transfer stage is provided on the carrier block side of the antireflection film-forming unit block for transferring a substrate, removed from the carrier, to the main transfer mechanism of the antireflection film-forming unit block; (h) a transfer mechanism is provided to transfer a substrate, removed from a carrier placed in the carrier block, to the transfer stage on the carrier block side associated with the antireflection film-forming unit block, and receive a substrate from the transfer stage on the carrier block side associated with said one or more developing unit blocks; and (i) said coating and developing apparatus further includes one of the following configurations (i-1), (i-2) and (i-3): (i-1) said coating and developing apparatus includes hardening modules to harden a resist pattern; all the developing modules included in said coating and developing apparatus are positive resist developing modules for developing a positive resist; the hardening modules are provided in one of the liquid processing unit blocks other than said one or more developing unit blocks; and the hardening modules are disposed on both sides of the transport passage of said one liquid processing unit; (i-2) said coating and developing apparatus includes hardening modules to harden a resist pattern; the hardening modules are provided in one of the liquid processing unit blocks other than said one or more developing unit blocks; and the developing modules included in said one or more developing unit blocks include positive resist-developing modules for developing a positive resist and negative resist-developing modules for developing a negative resist; (i-3) said coating and developing apparatus fails to include hardening modules; the developing modules include negative resist developing modules for developing a negative resist, said coating and developing method comprising: applying a positive resist liquid to a substrate by using one of the resist film-forming modules to form a first resist film; supplying a developer to the substrate by using one of the positive resist-developing modules to perform a first developing process to provide the first resist film with a first pattern; supplying, by using one of the hardening modules, a hardening liquid to the first resist film having the first pattern to harden it; applying a positive resist liquid to the hardened first resist film by using one of the resist film-forming modules; and supplying a developer to the substrate by using one of the positive resist-developing modules to perform a second developing process to provide the second resist film with a second pattern.

In yet another embodiment, there is provided a coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein: (a) the processing block includes a liquid processing block disposed on a carrier block side and a heating processing block disposed on an interface block side, the liquid processing block comprising a stack of a liquid processing unit blocks; (b) the liquid processing unit blocks include a stack of film-forming unit blocks comprising an antireflection film-forming unit block for forming an antireflection film on a substrate, a resist film-forming unit block for forming a resist film on the antireflection film and an upper film-forming unit block for forming an upper film on the resist film, which are stacked from bottom up in that order; and the liquid processing unit blocks further includes one or more developing unit blocks, for developing an exposed substrate, overlying or underlying a stack of the film-forming unit blocks; (c) each of the liquid processing unit blocks includes: a transport passage extending linearly from the carrier block side to the interface block side; liquid processing modules disposed on both sides of the transport passage for supplying a chemical liquid onto the substrate to form thereon the antireflection film, the resist film or the upper film; a main transfer mechanism that moves along the transport passage to transport the substrate to and from the liquid processing modules; (d) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules; (e) the heating processing block includes: a stack of heating modules including first heating modules assigned to the film forming unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules; (f) a transfer stage is provided on the interface block side of each of the film forming unit blocks for transferring a substrate coated with the chemical liquid in the film-forming unit block from the main transfer mechanism of the film-forming unit block to the vertical transport mechanism; and a transfer stage is provided on the interface block side of the developing unit block for transferring an exposed substrate from the vertical transport mechanism to the main transfer mechanism of the developing unit block; (g) a transfer stage is provided on the carrier block side of each of said one or more developing unit blocks for receiving a developed substrate from the main transfer mechanism of the developing unit block; a transfer stage is provided on the carrier block side of the antireflection film-forming unit block for transferring a substrate, removed from the carrier, to the main transfer mechanism of the antireflection film-forming unit block; (h) a transfer mechanism is provided to transfer a substrate, removed from a carrier placed in the carrier block, to the transfer stage on the carrier block side associated with the antireflection film-forming unit block, and receive a substrate from the transfer stage on the carrier block side associated with said one or more developing unit blocks; and (i) said coating and developing apparatus further includes one of the following configurations (i-1), (i-2) and (i-3): (i-1) said coating and developing apparatus includes hardening modules to harden a resist pattern; all the developing modules included in said coating and developing apparatus are positive resist developing modules for developing a positive resist; the hardening modules are provided in one of the liquid processing unit blocks other than said one or more developing unit blocks; and the hardening modules are disposed on both sides of the transport passage of said one liquid processing unit; (i-2) said coating and developing apparatus includes hardening modules to harden a resist pattern; the hardening modules are provided in one of the liquid processing unit blocks other than said one or more developing unit blocks; and the developing modules included in said one or more developing unit blocks include positive resist-developing modules for developing a positive resist and negative resist-developing modules for developing a negative resist; (i-3) said coating and developing apparatus fails to include hardening modules; the developing modules include negative resist developing modules for developing a negative resist, said coating and developing method comprising: applying a negative resist liquid to a first substrate by using one of the resist film-forming modules to form a first positive-type resist film; supplying a developer to the first substrate by using one of the negative resist-developing modules to provide the first positive-type resist film with a first pattern. This method may further includes: applying a positive resist liquid to a second substrate by using one of the resist film-forming modules to form a first positive-type resist film; supplying a developer to the second substrate to provide the first positive-type resist film with a first pattern; supplying a hardening liquid to the first positive-type resist film to harden it; applying a positive resist liquid onto the hardened first positive-type resist film by using one of the resist film-forming modules to form a second positive-type resist film; and supplying a developer to the second substrate by using one of the positive-resist developing modules to provide the second positive-type resist film with a second pattern.

In yet another embodiment, there is provide a non-transitory storage medium storing a computer program for use in a coating and developing apparatus, wherein the computer program is configured to perform the foregoing coating and developing method.

DETAILED DESCRIPTION OF EMBODIMENTS

Figure 1:
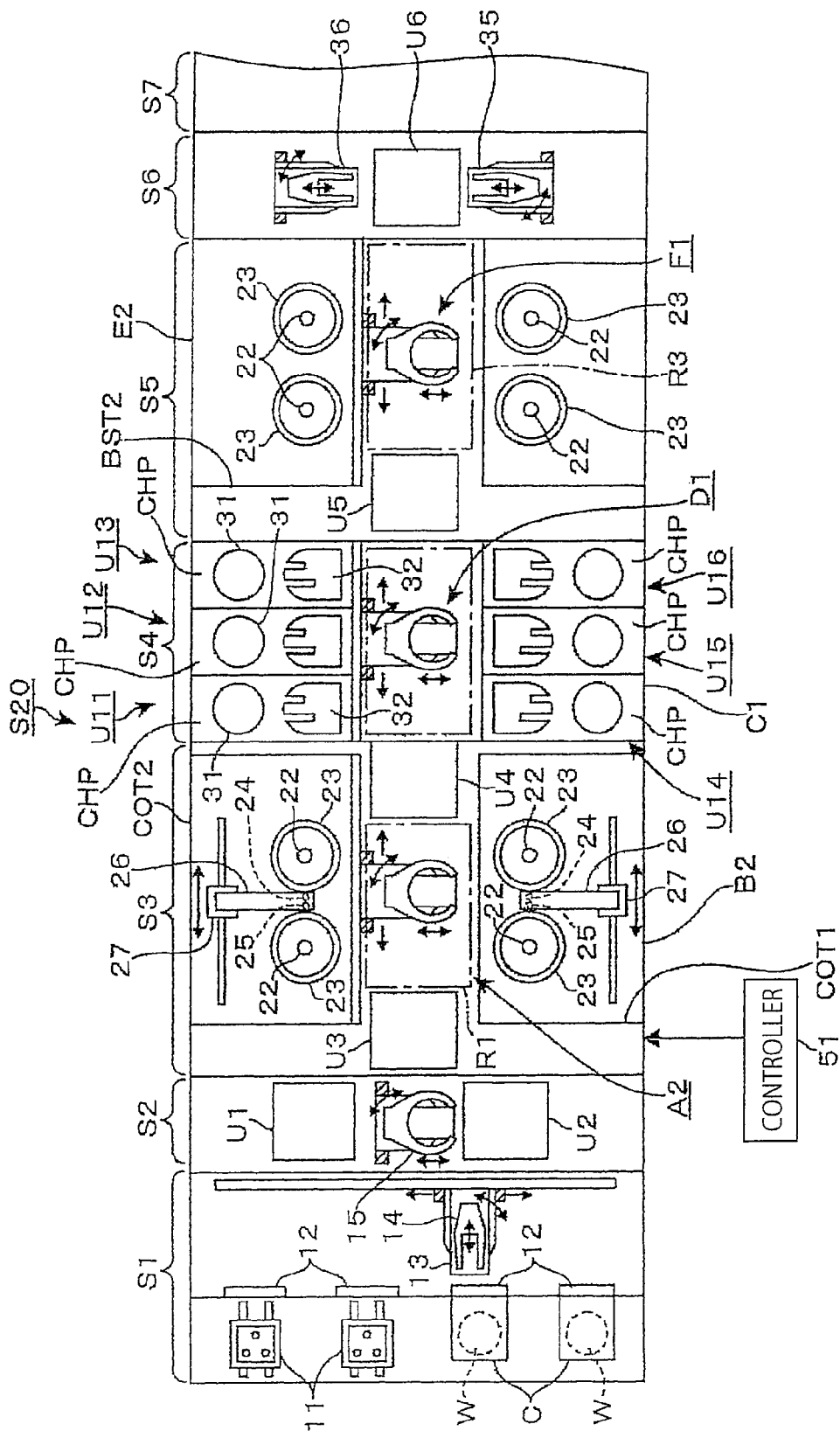
FIG. 1 is a plan view of a coating and developing apparatus in a first embodiment.
Figure 2:
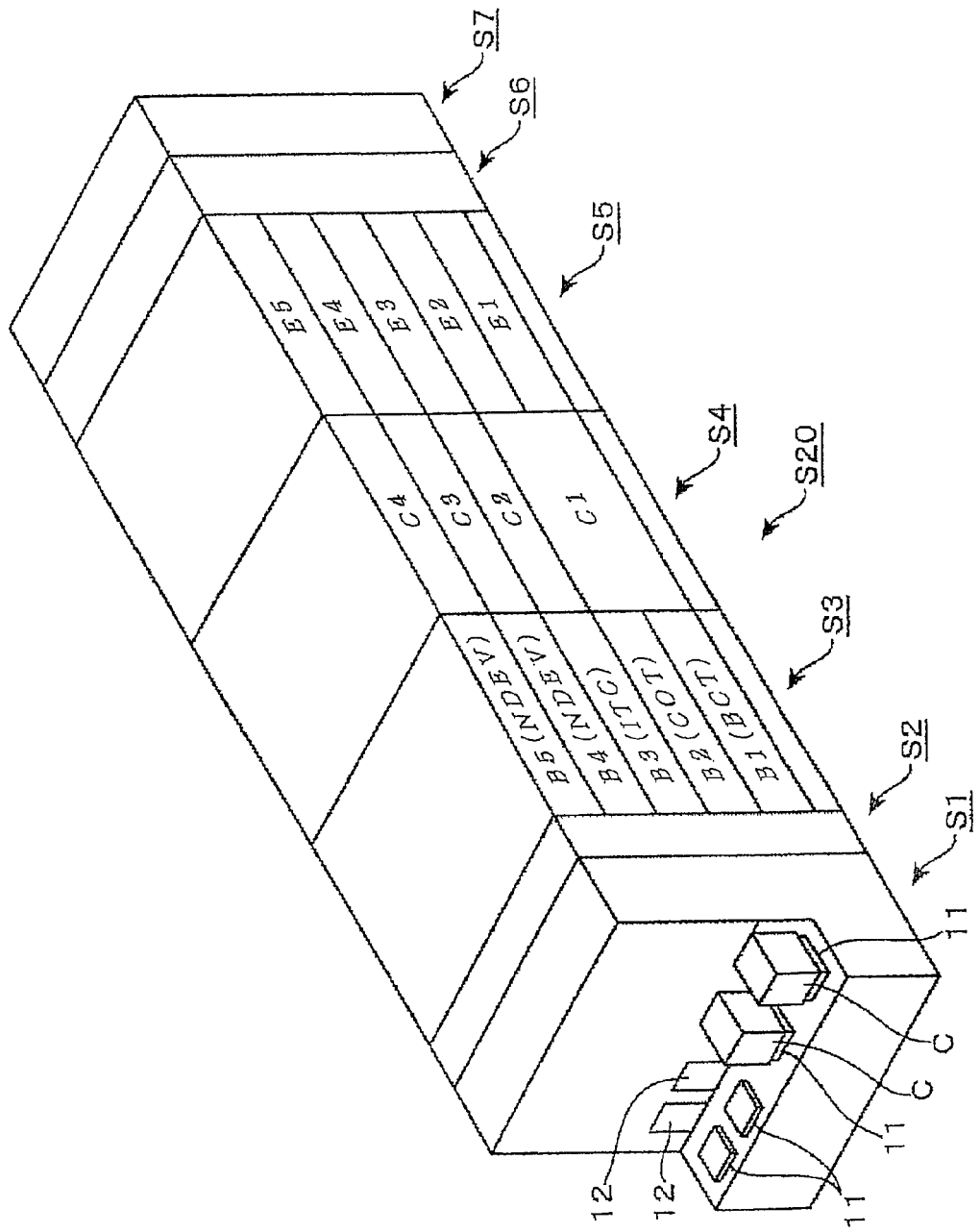
FIG. 2 is a perspective view of the coating and developing apparatus.

<First Embodiment>The construction of one embodiment of a coating and developing apparatus 1, which is embodied as a resist pattern-forming apparatus, will now be described with reference to FIGS. 1 to 3. The coating and developing apparatus 1 includes a carrier block S1 for receipt and deliver of carriers C, in each of which a plurality of, for example 25, wafers W are hermetically housed, a processing block S20 for performing processing of the wafers W, an auxiliary block S5 and an interface block S6, the blocks being arrayed linearly. To the interface block S6 is connected to an exposure apparatus S7 for performing immersion exposure. For the convenience of describing the positional relationship in the apparatus, the right side of FIG. 1 is hereinafter referred to as "anterior", the left side as "posterior", the upper side as "left", and the lower side as "right".

The carrier block S1 includes stages 11 for placing the carriers C thereon, shutters 12 provided in a wall in front of the stages 11, and a transfer arm 13 for taking wafers W out of the carriers C via the shutters 12. The transfer arm 13 has five wafer holders 14 arranged in the vertical direction, and is configured to be movable back and forth, vertically movable, rotatable about a vertical axis and movable in the carrier C arrangement direction. The transfer arm 13 transfers, at a time, five wafers W to a transfer module BU11 of the processing block S20. An element having a site on which a wafer W can be placed is herein referred to as "module". A module for carrying out processing of a wafer W, such as heating, processing with a liquid, supply of a gas, peripheral exposure, etc., is herein referred to as "processing module"; and a processing module for supplying a chemical liquid or a cleaning liquid is herein referred to as "liquid processing module".

Figure 4:
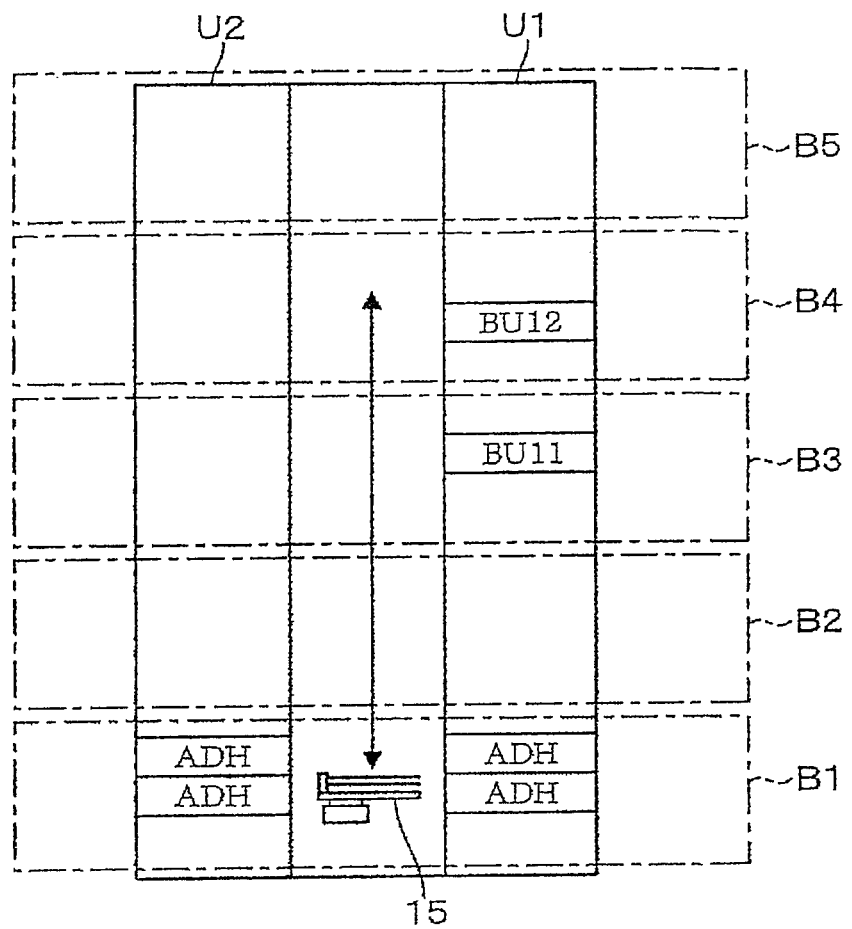
FIG. 4 is a vertical sectional side view of the anterior processing block of the coating and developing apparatus.

The processing block S20 is composed of an anterior processing block S2, a liquid processing block S3 and a heating processing block S4, which are arranged in that order from the carrier block S1 side to the auxiliary block S5 side. FIG. 4 is a schematic sectional side view of the anterior processing block S2. The anterior processing block S2 includes a shelf unit U1 and a shelf unit U2, each of which is composed of a plurality of modules stacked on top of each other. The shelf units U1 and U2 are arranged in right-and-left direction.

Each of the shelf units U1 and U2 has hydrophobizing modules ADH, which are disposed at the same level as a first liquid processing unit block B1 in the liquid processing block S3. The hydrophobizing module ADH is configured to supply a processing gas to the surface, including the bevel portion, of a wafer W to enhance the hydrophobicity of the surface of the wafer W, thereby preventing peeling off of a film from the wafer W during immersion exposure.

The unit block has transfer modules BU11 and BU12, the former BU11 being provided for receiving wafers W from a carrier C, the latter BU12 being provided for returning wafers W to a carrier C. The transfer module BU11 has five wafer holders arranged vertically at five different levels to collectively receive five wafers W at a time from the aforementioned transfer arm 13. The wafers W transferred to the transfer module BU11 are removed therefrom one by one, and then are subjected to predetermined process steps. The modules designated by reference signs including letters "BU" each have stages, each of which is configured to allow a wafer to be placed thereon to store the wafer.

Disposed between the shelf units U1 and U2 is a transfer arm 15 which is configured to be vertically movable, rotatable about a vertical axis and movable back and forth. The transfer arm 15 can transfer a wafer among the shelf units U1 and U2, and a shelf unit U3 described later.

Figure 5:
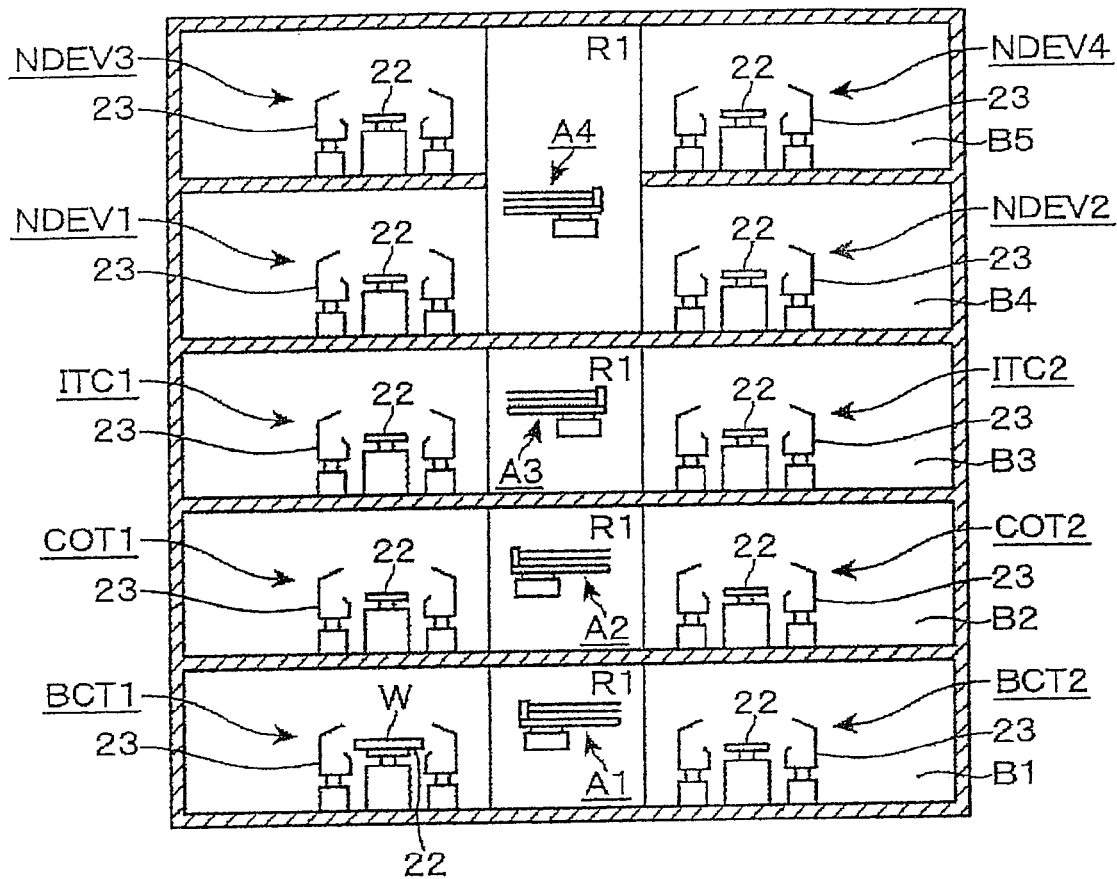
FIG. 5 is a vertical sectional front view of the liquid processing block of the coating and developing apparatus.

Referring to FIG. 5, the liquid processing block S3 is composed of liquid processing unit blocks B1, B2, B3, B4 and B5, which are stacked in that order from the bottom, and which are separated from each other by partitioning walls. The liquid processing unit blocks B1 to B5 have essentially the same mechanical structure and layout. FIG. 1 shows the second liquid processing unit block B2, which will be described as a representative of the liquid processing unit blocks B1 to B5. A transport region (transport passage) R1 is formed in the second liquid processing unit block B2 at the central area thereof to extend in anteroposterior direction. Resist film-forming modules COT1 and COT 2 are disposed on both sides (left side and right side) of the transport region R1 so as to oppose each other.

A main arm A2, which is a main transport mechanism, is provided in the transport region R1. The main arm A2 is configured to be movable back and forth, vertically movable, rotatable about a vertical axis and movable in the anteroposterior direction. The main arm A2 can transfer a wafer between the modules in the second liquid processing unit block B2.

The resist film-forming modules COT1 includes two spin chucks 22 arranged in the anteroposterior direction. Each spin chuck 22 is capable of attracting and holding a central portion of the back surface of a wafer W by suction and is rotatable about a vertical axis. A top-open processing cup 23 surrounds the periphery of the spin chuck 22 and prevents scattering of a resist liquid. When a wafer W is being processed, the wafer W is housed in the processing cup 23, with the central portion of the back surface of the wafer W being held by the spin chuck 22.

The resist film-forming modules COT1 has nozzles 24 and 25 which are shared by the two processing cups 23. The nozzle 24 is provided to supply a positive resist (a positive-type resist) liquid to a wafer, while the nozzle 25 is provided to supply a negative resist (a negative-type resist) liquid to a wafer. The nozzles 24 and 25 are supported by an arm 26. A drive mechanism 27, via the arm 26, moves the nozzles 24 and 25 in the arrangement direction of the processing cups 23 and vertically moves the nozzles 24 and 25. Thus, the nozzles 24 and 25 can be moved by means of the drive mechanism 27 between the two processing cups. 23. The nozzle 24 can therefore eject a negative (negative-type) or positive (positive-type) resist liquid toward the center of a wafer W held by each spin chuck 22. The resist liquid, which has been supplied from the nozzle 24 or 25 to the wafer W, spreads to the periphery of the wafer W due to centrifugal force caused by the rotation of the wafer W about a vertical axis, whereby a resist film is formed on the wafer W. Though not depicted, the resist film-forming module COT1 is provided with a nozzle for supplying a solvent to a peripheral portion of a wafer W to remove an unnecessary film in the peripheral portion. The resist film-forming module COT2 has the same structure as the resist film-forming module COT1.

The other processing unit blocks B1 and B3 to B5 will be briefly described. The other processing unit blocks B1 and B3 to B5 also includes modules having the same layout as that of the processing unit block B2. That is, liquid processing modules are disposed on both sides of the transport region R1 to oppose each other. Main arms A1 A2, A3 and, A4 are disposed in the processing unit blocks B1 to B4, respectively, so that in each processing unit block a wafer W is transported between the associated processing modules by the associated main arm independently of the other processing unit blocks. The first processing unit block B1 has the essentially the same structural features as the second processing unit block B2 except that the former has antireflection film-forming modules BCT1 and BCT2 instead of the resist film-forming modules COT1 and COT2 of the latter. The antireflection film-forming modules BCT1 and BCT2 have essentially the same structural features as the resist film-forming modules COT1 and COT2 except that the former is configured to supply a chemical liquid for forming an antireflection film to a wafer from a single nozzle 24 to form an antireflection film on the wafer W. The antireflection film-forming modules BCT1 and BCT2 have two processing cups 23 and two spin chucks 22, by which a single nozzle 24 is shared.

The third processing unit block B3 has essentially the same structural features as the second processing unit block B2 except that the former has protective film-forming modules ITC1 and ITC2 instead of the resist film-forming modules COT1 and COT2 of the latter. The protective film-forming modules ITC1 and ITC2 are each configured to supply a chemical liquid for forming a protective film to a wafer from a single nozzle 24 to form a protective film on the wafer W.

The fourth processing unit block B4 has essentially the same structural features as the second processing unit block B2 except that the former has negative resist-developing modules NDEV1 and NDEV2 instead of the resist film-forming modules COT1 and COT2 of the latter. The negative resist-developing modules NDEV1 and NDEV2 have essentially the same structural features as the resist film-forming modules COT1 and COT2 except that the former is configured to supply a developer for developing a negative resist (negative-type resist) instead of a resist liquid of the latter.

The fifth processing unit block B5 has essentially the same structural features as the second processing unit block B2 except that the former has negative resist-developing modules NDEV3 and NDEV4 instead of the resist film-forming modules COT1 and COT2 of the latter. The negative resist-developing modules NDEV3 and NDEV4 have the essentially the same structural features as the resist film-forming modules COT1 and COT2 except that the former is configured to supply a developer for developing a negative resist (negative type resist) instead of a resist liquid of the latter. As best shown in FIG. 5, the transport region R1 of the fourth processing unit block B4 and the transport region R1 of the fifth processing unit block B5 are vertically connected to each other. The main arm A4 is shared by the fourth and fifth processing unit blocks B4 and B5. The main arm A4 has, in addition to each of the main arms A1 to A3, a function of vertically moving between the fourth and fifth processing unit blocks B4 and B5, and thus can transfer wafers between modules in the fourth and fifth processing unit blocks B4 and B5.

Figure 3:
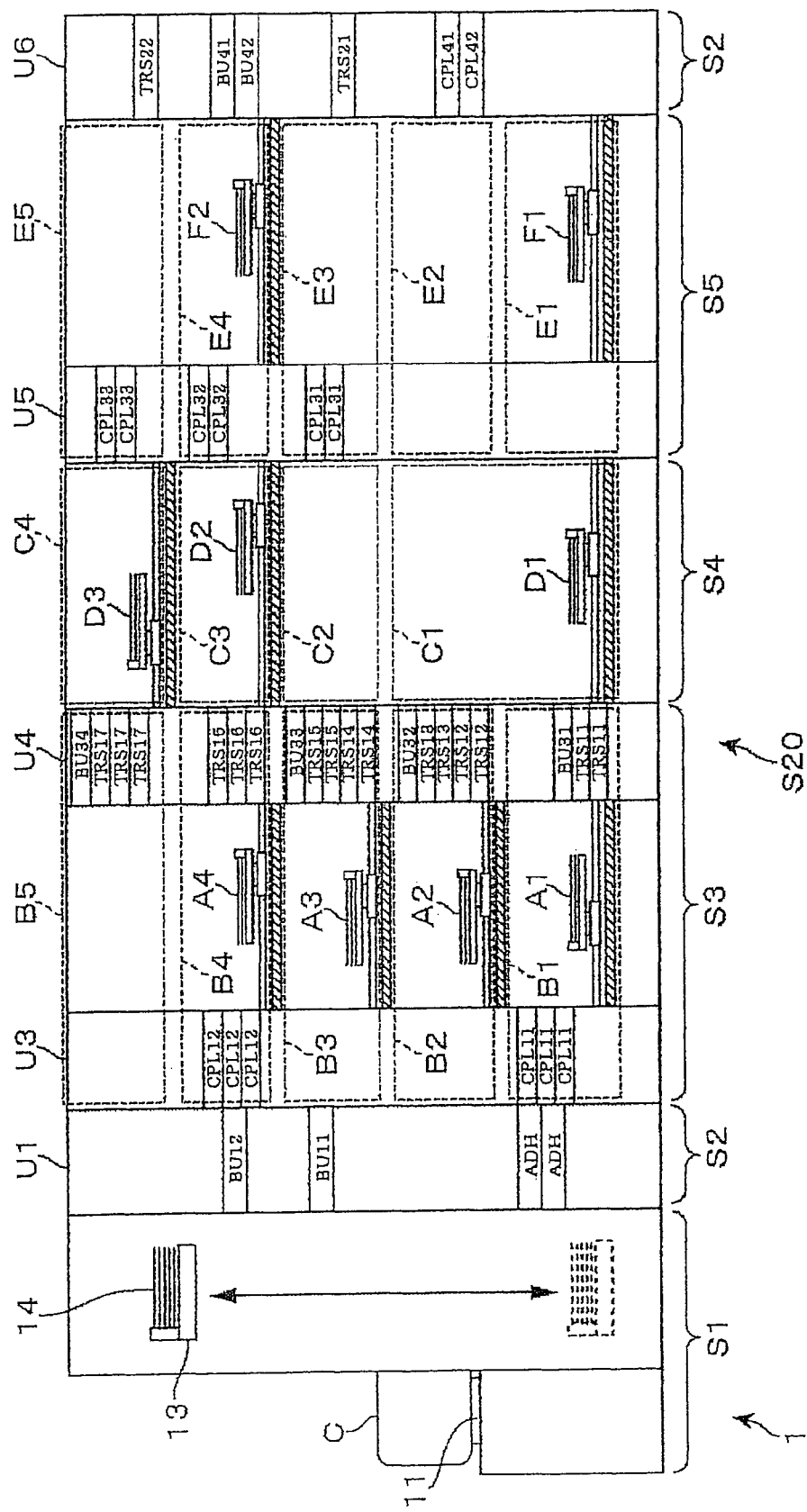
FIG. 3 is a vertical sectional side view of the coating and developing apparatus.

As shown in FIGS. 1 and 3, a shelf unit U3, vertically extending across the liquid processing unit blocks B1 to B5, is provided in the liquid processing block S3 at a position facing the carrier block S1. The shelf unit U13 is comprised of a stack of a plurality of modules, including transfer modules CPL11 and transfer modules CPL12 provided in height positions accessible by the main arms A1 and A4, respectively. Wafers W can be transferred between the anterior block S2 and liquid processing block S3 via the transfer modules CPL11 and CPL12. A transfer module with the reference sign "CPL" is provided with a cooling stage for cooling a wafer W placed on it. A transfer module with the reference sign "TRS" has a stage allowing a wafer W to be placed thereon.

As shown in FIGS. 1 and 3, a shelf unit U4, vertically extending across the liquid processing unit blocks B1 to B5, is provided in the liquid processing block S3 at a position facing the interface block S1. The shelf unit U4 is comprised of a stack of a plurality of modules, including transfer modules BU31, BU32, BU33 and BU 34 provided in height positions corresponding to the liquid processing unit blocks B1, B2, B3 and 85, respectively. In a case where a wafer cannot be loaded into a liquid processing module in a processing unit block because the liquid processing module is being occupied, by another wafer or subjected to maintenance work, the wafer is transported into the transfer module (any one of BU31-BU34) associated with the processing unit block (any one of B1-B5) to temporarily stand-by, before the wafer is loaded into the transport-destination module.

In the shelf unit U4, transfer modules TRS11 are provided in a height position corresponding to the liquid processing unit block B1, transfer modules TRS12 and TRS13 are provided in a height position corresponding to the liquid processing unit block B2, transfer modules TRS14 and TRS15 are provided in a height position corresponding to the liquid processing unit block B3, and transfer modules TRS16 are provided in a height position corresponding to the liquid processing unit block B4, and transfer modules TRS17 are provided in a height position corresponding to the liquid processing unit block B5. Wafers W can be transferred between the liquid processing block S3 and heating processing block S4 via the transfer modules TRS11 to TRS17.

Figure 6:
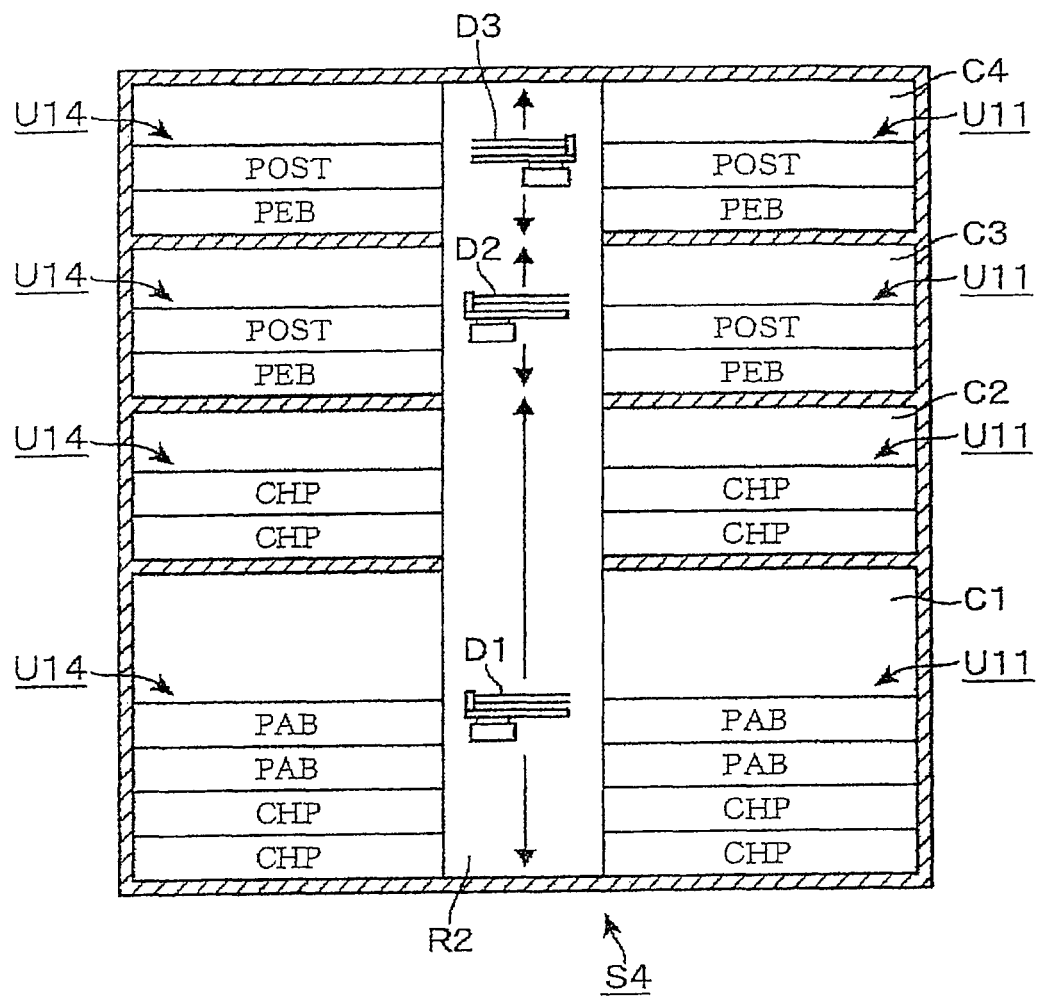
FIG. 6 is a vertical sectional front view of a heating processing block of the coating and developing apparatus.

Referring also to FIG. 6, the heating processing block S4 is composed of heating processing unit blocks C1, C2, C3 and 04, which are stacked in that order from the bottom, and which are separated from each other by partitioning walls. The heating processing unit block C1 is disposed laterally adjacent to the liquid processing unit blocks B1 and B2; the heating processing unit block C2 is disposed laterally adjacent to the liquid processing unit blocks B3; and the heating processing unit block C3 and C4 are disposed laterally adjacent to the liquid processing unit blocks B4 and B5, respectively. Each of the heating processing unit block C1 to C4 includes: heating modules; a main arm (D1-D3) which is a transport means of the individual heating processing unit block (C1-C4); and a transport region R2 within which the main arm (D1-D3) moves.

The heating processing unit blocks C1 to C4 have essentially the same mechanical structure. FIG. 1 shows the first heating processing unit block C1, which will be described as a representative of the liquid processing unit blocks C1 to C4. The transport region R2 is formed in the first heating processing unit block C1 at the central area thereof to extend in anteroposterior direction. Shelf units U11, U12 and U13 are arrayed in a row along the transport region R2 on the left side thereof, while shelf units U14, U15 and U16 are arrayed in a row along the transport region R2 on the right side thereof, so that the shelf units U11, U12 and U13 and the shelf units U14, U15 and U16 oppose each other across the transport region R2. Each of the shelf units U11 to U16 includes heating modules stacked in multiple (e.g., four) layers. The main arm D1 is arranged in the transport region R2. The main arm D1 is configured to be movable back and forth, vertically movable, rotatable about a vertical axis and movable in the anteroposterior direction, which will be described in more detail, later.

The heating module has a hot plate 31 for heating a wafer W placed thereon, and a cooling plate 32 for cooling the wafer W and also for transferring the wafer W between the hot plate and the main arm D1. The wafer W heated by the hot plate 31 is transferred to the cooling plate 32, is cooled on the cooling plate 32, and then is transferred to the main arm D1. In FIG. 6, the heating modules for heating a wafer after formation an antireflection film is designated by the reference sign "CHP", and the heating modules for heating a wafer after formation a resist film is designated by the reference sign "PAB".

The second heating processing unit block 02 has a planner arrangement similar to that of the first heating processing unit block C1, while the second heating processing unit block C2 is different from the first heating processing unit block C1 in that, in the former, each of the shelf units U14, U15 and U16 includes heating modules stacked in two layers. The heating modules are provided for heating a wafer W after formation of a protective film, and are designated by the reference sign "CHP". The main arm D1 is shared by the first and second heating processing unit blocks C1 and C2; the main arm D1 can transfer a wafer to and from the modules in the first and second heating processing unit blocks C1 and C2, the modules of the shelf unit U4 provided in height positions corresponding to the first and second heating processing unit blocks C1 and C2 and modules of the shelf unit U5 (described later) provided in height positions corresponding to the first and second heating processing unit blocks C1 and C2.

The third heating processing unit block C3 has essentially the same structure as the second heating processing unit block C2 but differs from the latter in that the former has a main arm D2 provided exclusively for the third heating processing unit block C3. The main arm D2 can transfer a wafer W to and from the modules in the third heating processing unit block C3, the modules of the shelf unit U4 provided in a height position corresponding to the third heating processing unit block C3 and modules of the shelf unit U5 provided in a height position corresponding to the third heating processing unit block C3. The heating modules contained in the third heating processing unit block C3 are heating modules for heating a wafer after exposure designated by reference sign "PEB", and heating modules for heating a wafer after development designated by reference sign "POST". The fourth heating processing unit block C4 has essentially the same structure as the third heating processing unit block C3, and has a main arm D3 which is essentially the same as the main arm D2. The main arms D1, D2 and D3 constitute a "vertical transport mechanism".

Figure 7:
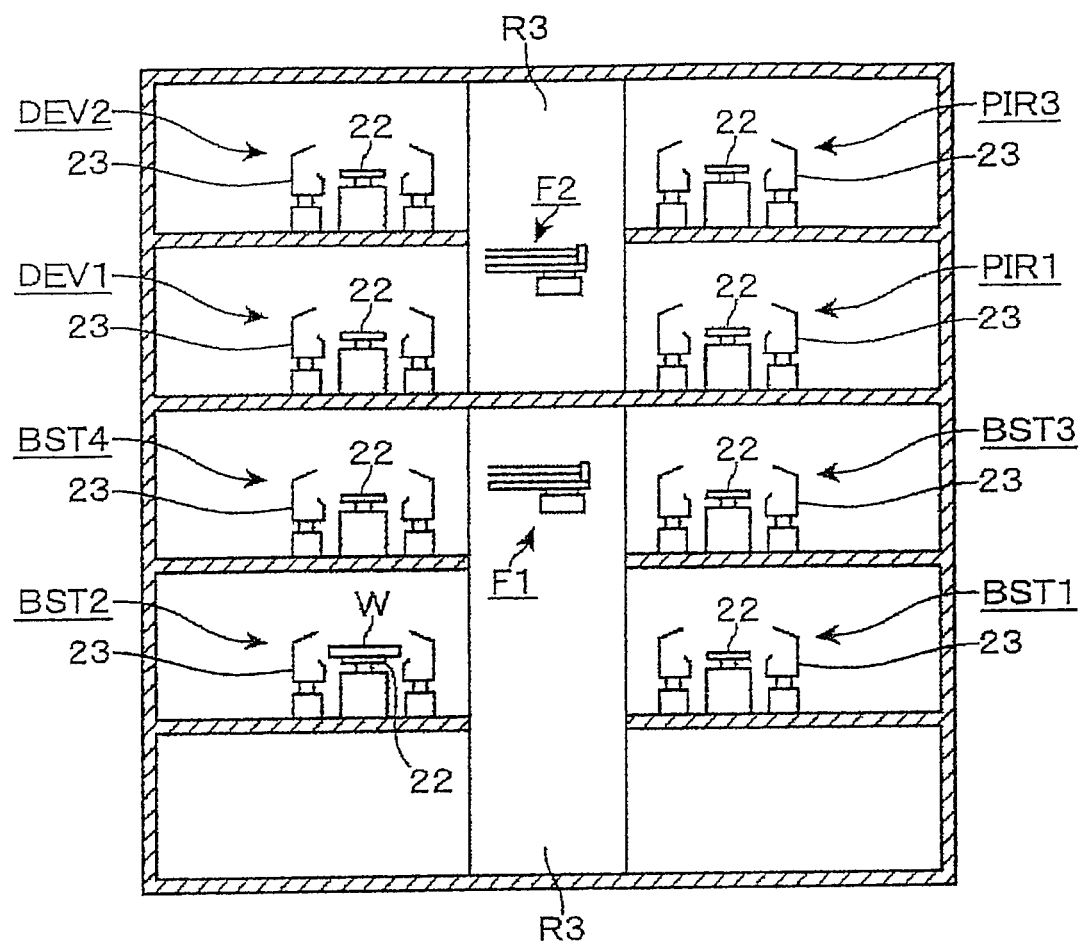
FIG. 7 is a vertical sectional front view of an auxiliary block of the coating and developing apparatus.

Referring to FIG. 7, the auxiliary processing unit block S5 is composed of auxiliary processing unit blocks E1, E2, E3, E4 and E5, which are stacked in that order from the bottom, and which are separated from each other by partitioning walls. The auxiliary processing unit blocks E1 and E2 are disposed laterally adjacent to the first heating processing unit block C1; and the auxiliary processing unit blocks E3, E4 and E5 are disposed laterally adjacent to the third, fourth and fifth heating processing unit blocks C2, C3 and C4, respectively.

FIG. 1 shows the second auxiliary processing unit block E2, which will be described as a representative of the auxiliary processing unit blocks E1 to E5. A transport region R3 is formed in the second auxiliary processing unit block B2 at the central area thereof to extend in anteroposterior direction. Back surface cleaning modules BST1 and BST2 are disposed on both sides (left side and right side) of the transport region R3 so as to oppose each other. The back surface cleaning module (BST) has essentially the same mechanical structure as that of the antireflection film-forming module (BCT), and has two processing cups 23 and two spin chucks 22, but the former differs from the latter in that the former has two nozzles (not shown) each assigned to respective ones of the processing cups 23, instead of the previously described nozzle 24 of the latter. Provided in the transport region R3 is a main arm F1, which is configured to be movable back and forth, vertically movable, rotatable about a vertical axis and movable in the anteroposterior direction.

The first auxiliary processing unit block E1 also has a transport region R3 like the second auxiliary processing unit block E2, but does not have liquid processing modules. The first auxiliary processing unit block E3 has the same construction as the second auxiliary processing unit block E2, and has back surface cleaning modules BST3 and BST4 having the same construction as the back surface cleaning modules BST1 and BST2. The transport regions R3 of the first to third auxiliary processing unit blocks E1 to E3 are vertically connected to form a single transport region, and share the main arm F1. The main arm F1 transfers a wafer between modules provided in the first to third auxiliary processing unit blocks E1 to E3 and modules provided in shelf units U5 and U6 (described later in detail) disposed at the levels (heights) of the first to third auxiliary processing unit blocks E1 to E3.

Figure 8:
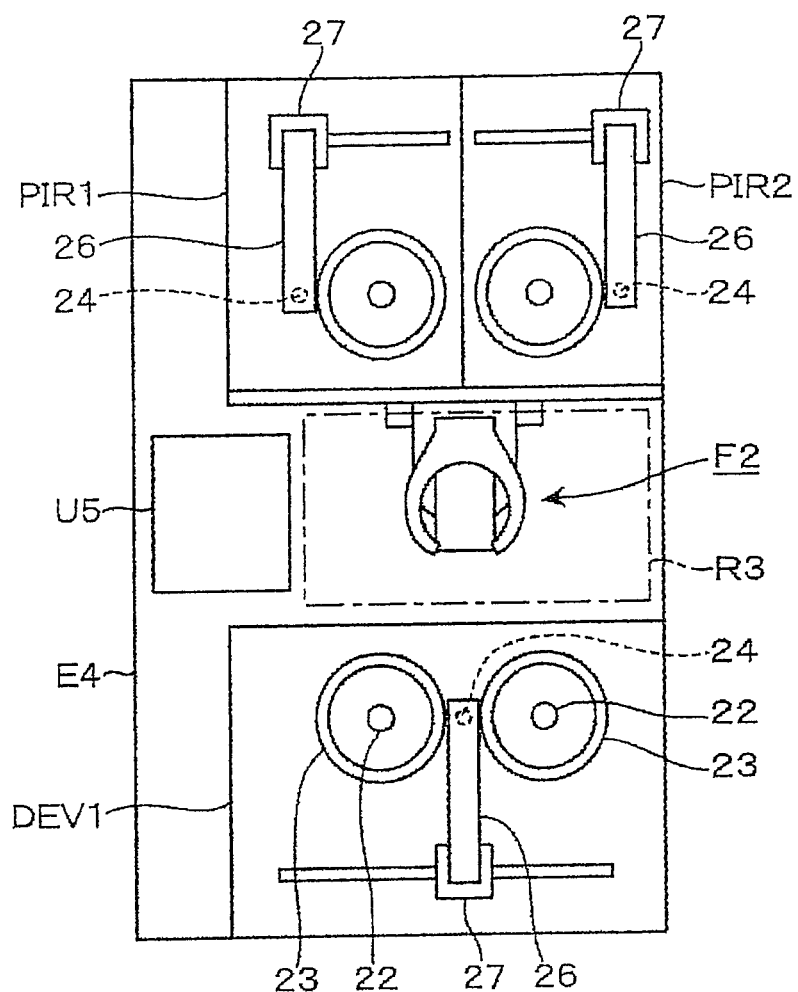
FIG. 8 is a top plan view of the auxiliary block of the coating and developing apparatus.

FIG. 8 is a plan view of the fourth auxiliary processing unit block E4. The fourth auxiliary processing unit block E4 has a transport region R3 like the second auxiliary processing unit block E2, but differs from the second auxiliary processing unit block E2 in that the fourth auxiliary processing unit block E4 has a developing module DEV1 and post-exposure cleaning modules PIR1 and PIR2 instead of the back surface cleaning module BST. The post-exposure cleaning modules PIR1 and PIR2 are arrayed in the anteroposterior direction and face the transport region R3. The developing module DEV1 faces the post-exposure cleaning modules PIR1 and PIR2 across the transport region R3.

The post-exposure cleaning modules PIR1 and PIR2 are each provided to supply a processing liquid for removing the protection film or for cleaning, and each have the same mechanical structure as the resist film forming module COT except that one nozzle 24 is provided for one processing cup 23 and one spin chuck 22. The developing module DEV1 has the same mechanical construction as the resist film-forming module COT1 (i.e., one nozzle 24 is shared by two processing cups 24), but differs from the resist film-forming module COTI in that the developing module DEV1 (also DEV2) supplies a developer for developing a positive (positive-type) resist instead of a resist liquid. That is, the developing module DEV1 is a positive resist-developing module.

The fifth auxiliary processing unit block E5 includes a developing module DEV2 corresponding to the developing module DEV1, and post-exposure cleaning modules PIR3 and PIR4 corresponding to the post-exposure cleaning modules PIR1 and PIR2. The fourth and fifth auxiliary processing unit blocks E4 and E5 share a main arm F2 corresponding to the main arm F1. The main arm F2 transfers a wafer between modules provided in the fourth and fifth auxiliary processing unit blocks E4 and E5 and modules provided in shelf units U5 and U6 (described later in detail) disposed at the levels (heights) of the fourth and fifth auxiliary processing unit blocks E4 and E5.

As shown in FIGS. 1 and 3, a shelf unit U5 is provided on the carrier block S1 side in the transport regions R3 to extend vertically from the first auxiliary processing unit block E1 to the fifth auxiliary processing unit block E5. In the shelf unit U5, transfer modules CPL31 is provided at height positions accessible by the main arm F1, and transfer modules CPL32 and CPL33 are provided at height positions accessible by the main arm F2.

Figure 9:
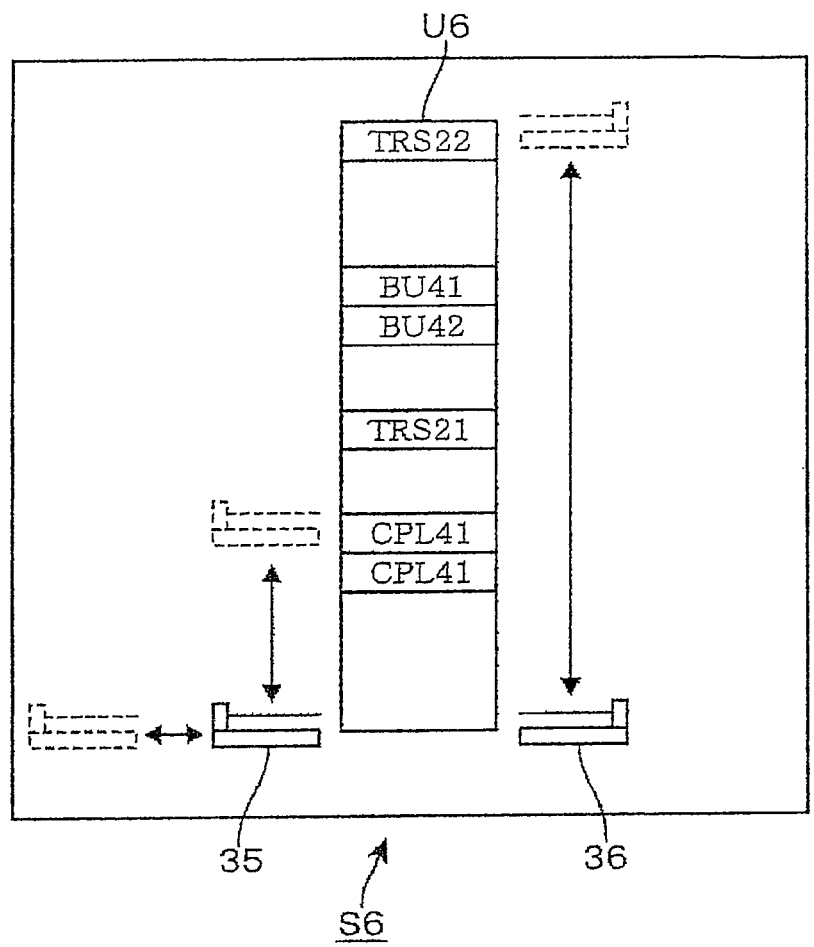
FIG. 9 is a vertical sectional front view of an interface block of the coating and developing apparatus.

The interface block S6 will be described with further reference to FIG. 9 which is the vertical sectional view of the interface block S6. A shelf unit U6 formed by stacking modules in multiple layers is provided in the interface block S6. In the shelf unit U6, a transfer module TRS21 is provided at a height position accessible by the main arm F2, and transfer modules TRS22 is provided at a height position accessible by the main arm F1. In the shelf unit U6, transfer modules BU41, BU42, CPL41 and CPL42 are also provided.

Interface arms 35 and 36 are provided in the interface block S6. The interface arms 35 and 36 are each configured to be movable back and forth, vertically movable, rotatable about a vertical axis, and also horizontally movable. The interface arm 35 can access the exposure apparatus S7, the transfer modules CPL41 and CPL 42, and transfer a wafer W between those modules. The interface arm 36 can access the modules constituting the shelf unit U6, and transfer a wafer W between those modules.

Figure 10:
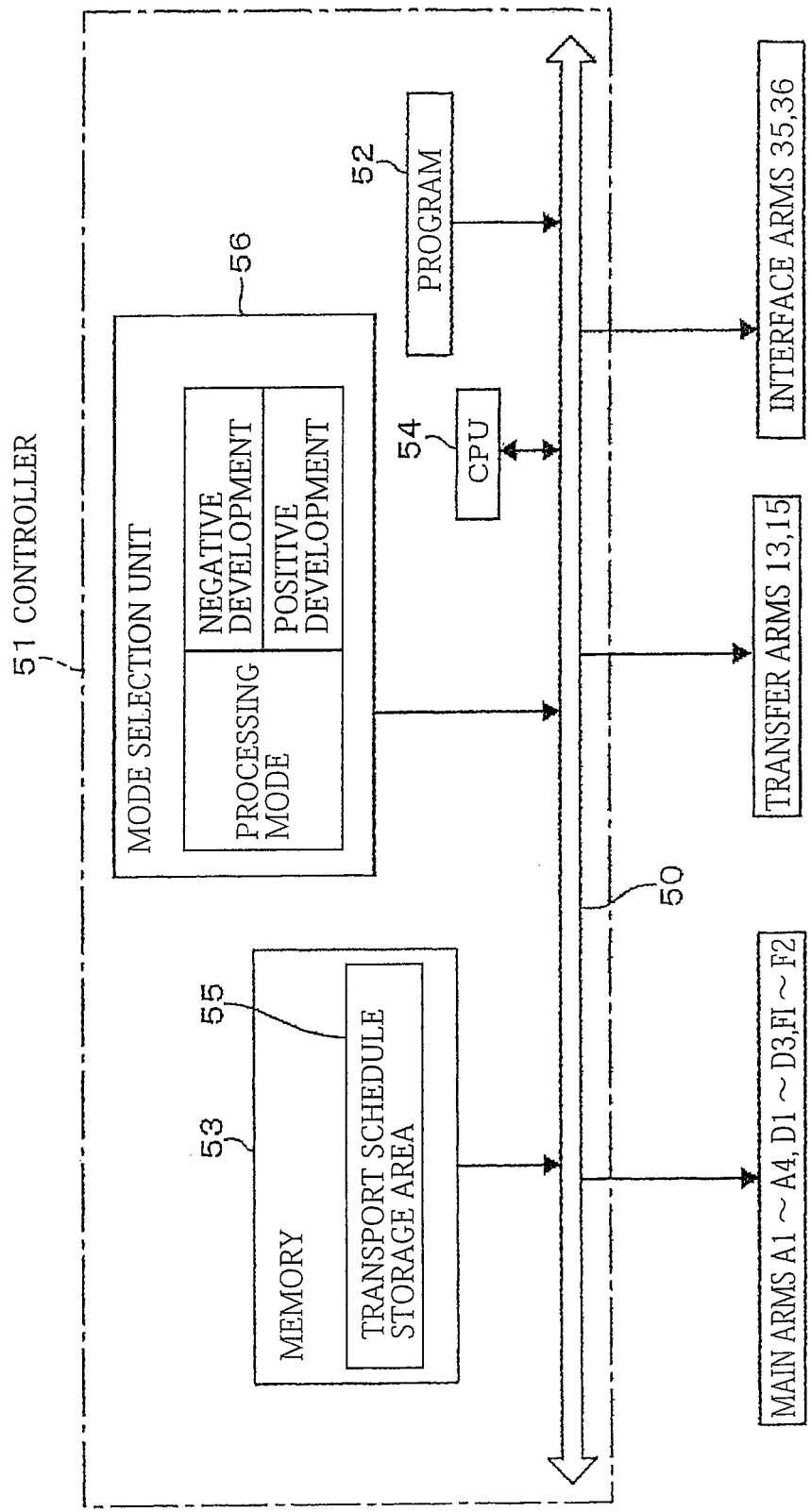
FIG. 10 is a diagram showing the construction of the control section of the coating and developing apparatus.

The controller 51 provided in the coating and developing apparatus 1 will now be described with reference to FIG. 10. In FIG. 10, reference numeral "50" denotes a bus. The controller 51 includes a program 52, a memory 53, a CPU 54, etc. The program 52 contains instructions (steps) to output control signals to various components of the coating and developing apparatus 1, to transport wafers W between modules in the below-described manners, and to carry out processing of each wafer W. The program 52 (including program for displaying and inputting of process parameters) is stored in a non-transitory storage medium such as flexible disk, compact disk, hard disk, MO (magneto-optical) disk, memory card, etc., and installed in the controller 51.

The memory has a storage area 55 for storing transfer schedules showing the relationship between, the ID of a wafer, the transfer destination modules of the wafer, the sequence (order) of transporting the wafer to the transfer destination modules. The controller 51 has a mode selection unit 56, by which one of processing modes can be selected for each production lot of wafers W. The processing modes includes: a negative development processing mode in which a negative resist is applied to a wafer in the resist film-forming module COT and the wafer is developed in the negative resist-developing module NDEV; and a positive development processing mode in which a positive resist is applied to a wafer in the resist film-forming module COT and the wafer is developed in the positive developing module DEV. The transfer schedule is determined based on the selected processing mode. Note that, in this specification, the reference signs designating the processing modules are sometimes simplified by removing the numeral part thereof (e.g., COT1→COT) in a case where there is no need to distinguish individual modules from each other.

Next, the wafer transport route in the coating and developing apparatus 1, in a case where the user selects a negative development processing mode, will be described. The explanation will be made with reference to FIG. 11, in which the transport route is indicated by chain lines. A wafer W is transferred from a carrier C to the transfer module BU11 in the shelf unit U1 by the transfer arm 13, and transferred to the transfer arm 15 and then to the hydrophobizing unit ADH in the shelf unit U1 or U2, in which the wafer is subjected to a hydrophobizing treatment. Thereafter, the wafer W is transferred, in the following order, to the transfer arm 15→the transfer module CPL11 of the shelf unit U3→the main arm A1 of the first liquid processing unit block B1→the antireflection film-forming module BCT1 or BCT2 in which an antireflection film is formed on the wafer W.

After the formation of the antireflection film, the wafer W is transferred, in the following order, to the main arm A1→the transfer module TRS11 of the shelf unit U4→the main arm D1 of the first heat processing unit block C1→the heating module CHP→the main arm D1→the transfer module TRS12 of the shelf unit U4→the main arm A2 of the second liquid processing unit block B2→the resist film-forming unit COT1 or COT2 in which a negative resist film is formed on the wafer W.

Subsequently, the wafer W is transferred, in the following order, to the main arm A2→the transfer module TRS13 of the shelf unit U4→the main arm D2→the heating module PAB→the main arm D1→the transfer module TRS14 of the shelf unit U4→the main arm A3 of the third liquid processing unit block B3→the protective film-forming unit ITC1 or ITC2 in which a protective film is formed on the resist film.

Then, the wafer W is transferred, in the following order, to the main arm A3→the transfer module TRS15 of the shelf unit U4→the main arm D1→the heating module CHP→the main arm D1→the transfer module CPL31 of the shelf unit U5→the main arm F1 of the first to third auxiliary unit block E1 to E3→one of the back surface cleaning module BST1 to BST4 in which the wafer is subjected to the back surface cleaning process. Thereafter, the wafer W is transferred, in the following order, to the main arm F1→the transfer module TRS21 of the shelf unit U6→the interface arm 36→the transfer module BU41→the interface arm 36→the transfer module CPL41→the interface arm 35→the exposure apparatus S7 in which the wafer is subjected to immersion exposure.

Figure 12:
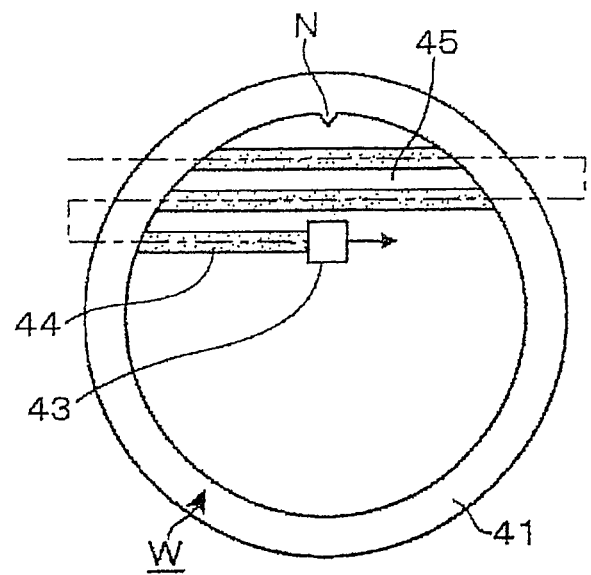
FIG. 12 is a diagram illustrating exposure of a wafer W.
Figure 13:
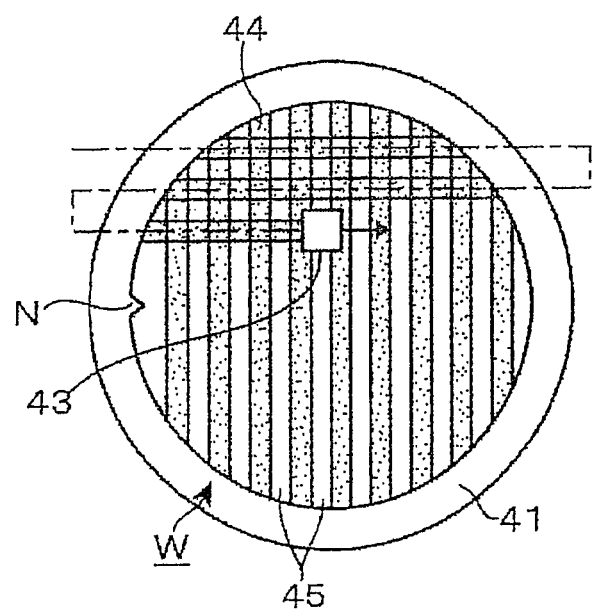
FIG. 13 is a diagram illustrating exposure of a wafer W.

FIGS. 12 and 13 illustrate processing of a wafer in the exposure apparatus S7. In the figures, reference numeral "41" denotes a stage on which a wafer W to be exposed is placed. The stage 41 rotates on a vertical axis. Reference letter "N" denotes a notch formed in the wafer W. Reference numeral "43" denotes an exposure head which moves while exposing the wafer W. The exposure head 43 moves on parallel lines across the wafer W, as shown by the arrow and the dashed line, while applying light to the wafer W. A striped-pattern exposed area 44 is thus formed in the wafer W. In the figures, the exposed area 44 is shown by the dotted area. Thereafter, the wafer W rotates by 90 degrees, and the exposure head 43 again moves in the same manner over the wafer W, thereby exposing the wafer W in a lattice pattern. In the figures, reference numeral "45" denotes a non-exposed area.

Figure 11:
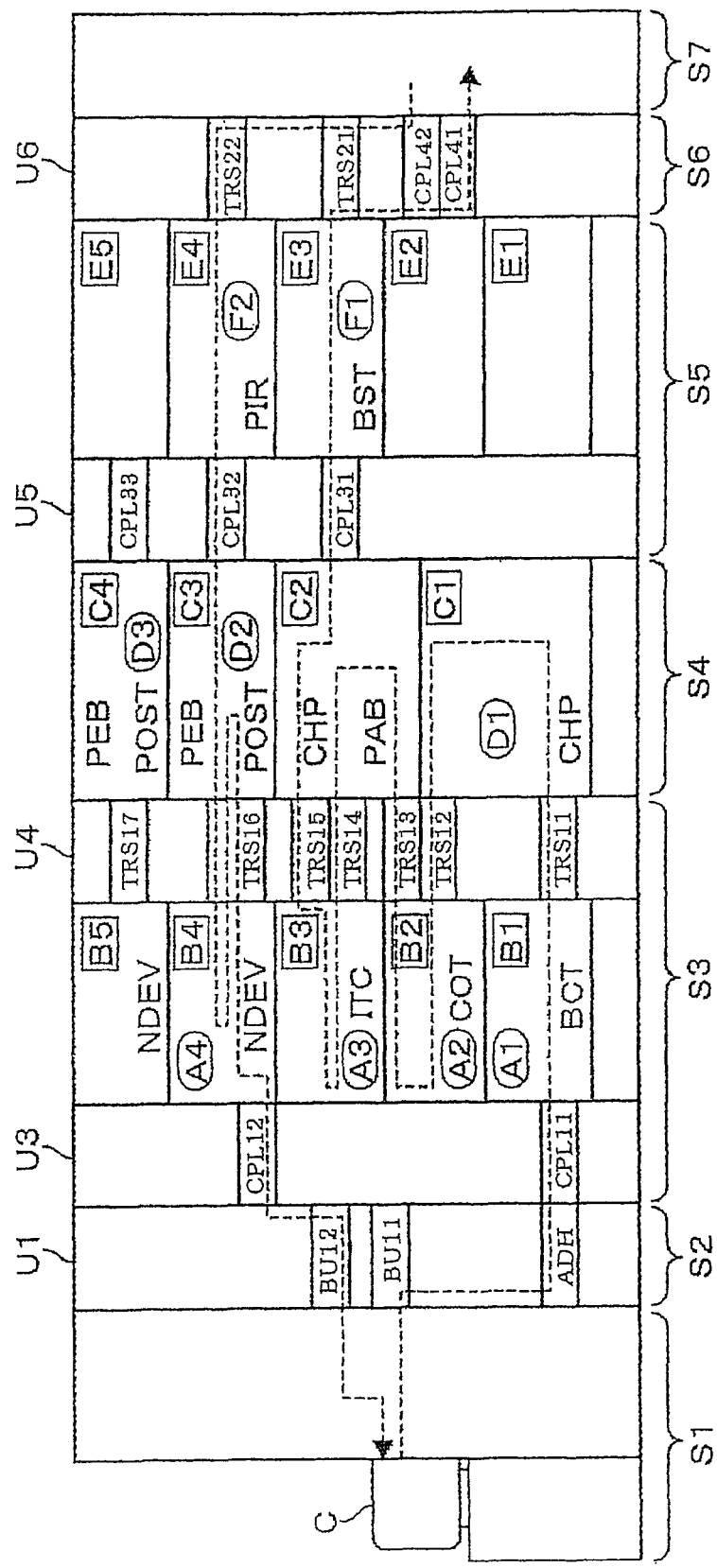
FIG. 11 is a flow diagram illustrating a wafer transport route in the coating and developing apparatus.

Turning back of FIG. 11, after the immersion exposure, the wafer W is transferred, in the following order, to the interface arm 35→the transfer module CPL42→the interface arm 36→the transfer module BU42→the interface arm 36→the transfer module TRS22→the main arm F2 of the fourth and fifth auxiliary unit block E4 and E5→one of the post-exposure cleaning modules PIR1 to PIR4 in which the wafer W is subjected to the protective film-removing and cleaning process.

Thereafter, the wafer W is transferred, in the following order, to the main arm F2→the transfer module CPL32 or CPL33 of the shelf unit U5→the main arm D2 of the third heating processing unit block C3 or the main arm D3 of the fourth heating processing unit block C4→the heating module PEB→the main arm D2 or D3→the transfer module TRS16 or TRS17 of the shelf unit U4→the main arm A4 of the fourth and fifth liquid processing unit block E4 and E5→one of the negative resist-developing modules NDEV1 to NDEV4 in which the developer is supplied to the wafer W so that the non-exposed area 65 is dissolved in a developer to form a lattice-like pattern of holes. The holes can be used, for example, for the formation of contact holes.

Then, the wafer W is transferred, in the following order to, the main arm E4→the transfer module TRS16 or TRS17 of the shelf unit U4→the main arm D2 or D3→the heating module POST→the main arm D2 or D3→the transfer module TRS16 or TRS17→the main arm A4→the transfer module CPL12 of the shelf unit U3→the transfer arm 15→the transfer module BU12→the transfer arm 13→the carrier C.

Next, the wafer transport route in the coating and developing apparatus 1, in a case where the user selects a positive development processing mode, will be described, focusing on the differences from the foregoing case where the user selects the negative development processing mode. As is the case with the negative development, a wafer W is transported from a carrier C to the resist film-forming module COT1 or COT2 in which a positive resist liquid is applied to the wafer W. Then, as is the case with the negative development, the wafer W is transported from the resist film-forming module (COT1 or COT2) to the exposure apparatus S7. Unlike the case with the negative development, the exposure process in the exposure apparatus S7 does not perform the rotation of the stage 41 and the subsequent movement and exposure by the exposure head 43 after the first exposure of the whole surface of the wafer. Thus, the pattern formed by the positive development processing mode is different from that formed by the negative development processing mode.

After the exposure process, the wafer W is transported to the one of the post-exposure cleaning modules PIR1 to PIR4 and to the heating module PEB along the same transport route as that of the negative development processing mode, in which the wafer W is subjected to the predetermined processes. Thereafter, the main arm D2 or D3 of the heating processing unit block C3 or C4 transports the wafer to the transfer module CPL32 or CPL33. Then, the main arm F2 transports the wafer W to the developing module DEV1 or DEV2, in which a developer for positive development is supplied to the wafer W, the exposed portions of the resist film is dissolved. Thereafter, the wafer is transported, in the following order, to the main arm F2→the transfer module CPL32 or CPL33→the main arm D3 or D4→the heating module POST. After that, the wafer W is returned to the carrier C through the same transport route as that of the negative development processing mode.

Figure 14:
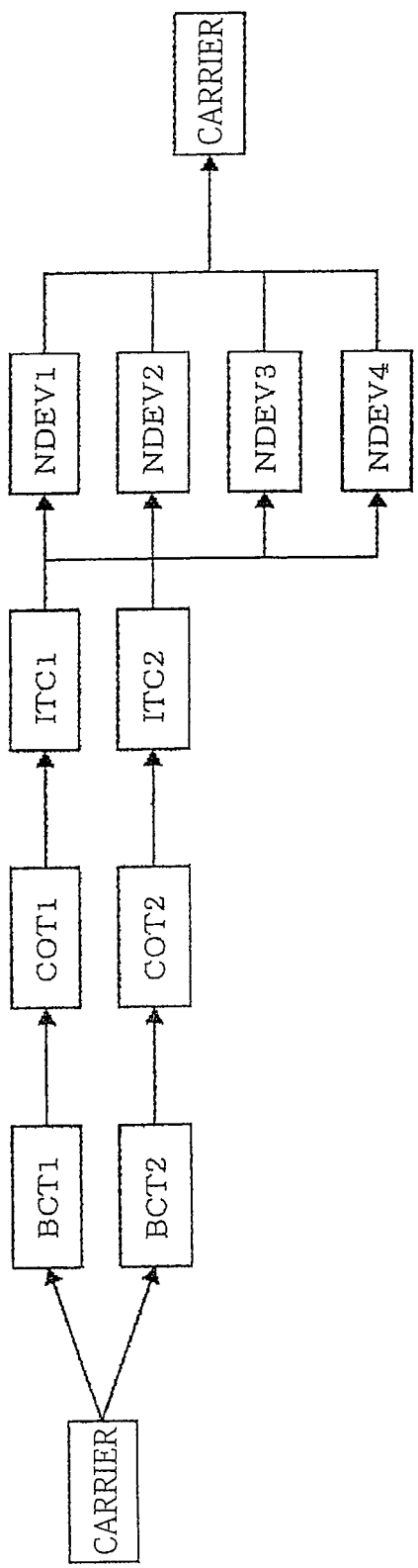
FIG. 14 is a flow diagram illustrating a wafer transport route in the normal situation.

If one of the liquid processing modules in a liquid processing unit block (e.g., one of B1 to B5) becomes unusable (fails) when wafers W are being sequentially transported along the transport route to be subjected to various processing, the transport schedule is rewritten such that the subsequent wafers W are transported into the other liquid processing module opposing the unusable liquid processing module in the liquid processing unit. FIG. 14 schematically shows the transport route in normal operation; while FIG. 15 schematically shows the transport route in a case where the resist film-forming module COT2 and the negative developing module NDEV2 are unusable.

Figure 15:
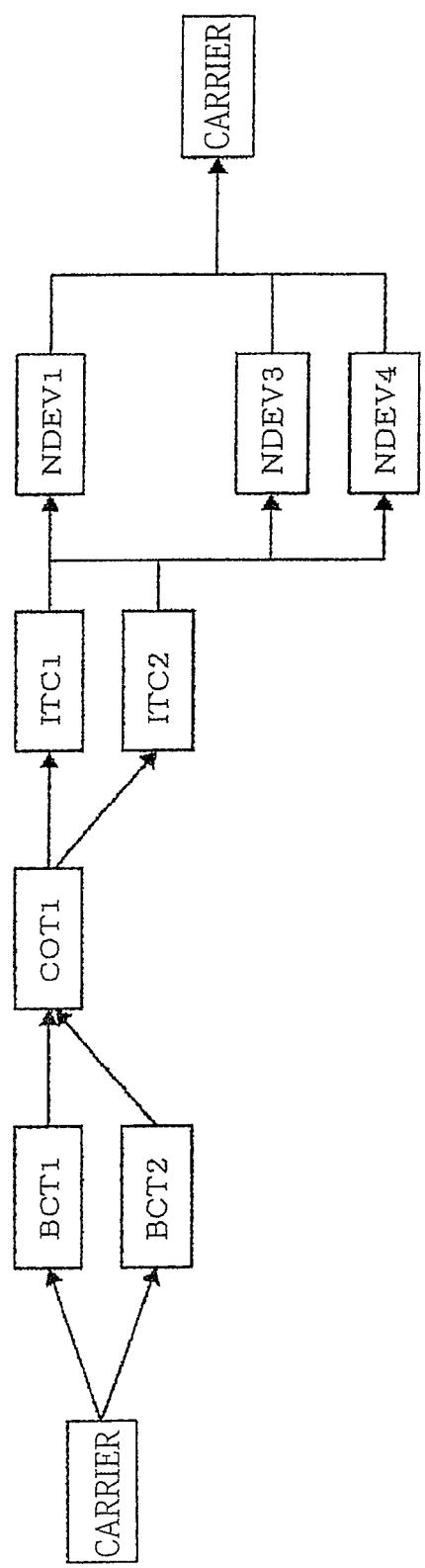
FIG. 15 is a flow diagram illustrating a wafer transport route in a case where abnormality occurs in a liquid processing module.

As shown in FIG. 15, the transport schedule of the subsequent wafers W which are scheduled to be transported into the unusable resist film-forming module COT2 is changed such that they are transported into the resist film-forming module COT1 to be processed therein; the transport schedule of the subsequent wafers W which are scheduled to be transported into the unusable negative resist-developing module NDEV2 is changed such that they are transported into the negative resist-developing module NDEV1 to be processed therein. Similarly, if one of the protective film-forming units (ITC1 or ITC2) or one of the antireflection film-forming modules (BCT1 or BCT2) becomes unusable, the transport schedule is changed such that the subsequent wafers W are transported into the liquid processing module opposing the unusable liquid processing module of the same type. In detail, a liquid processing module is unusable when the liquid processing module fails or when the liquid processing module is subjected to maintenance. In case of failure of a liquid processing module, the controller 51 automatically changes the transport schedule. In case of maintenance, the user must designate the liquid processing module which is to be subjected to maintenance, and then the controller 51 automatically changes the transport schedule.

In the first embodiment described above and in the embodiments and the modifications described later, the timing at which the wafer W is subjected to the hydrophobizing process is not limited to that described above. For example, the transport route may be changed as follows: After formation of the resist film and the subsequent heating processing in the heating module PAB, the wafer may be transported through the main arm D1, the main arm A2 and the transfer module in the shelf unit U3 to one of the hydrophobizing modules ADH in the shelf units U1 and U2 in which the wafer W may be subjected to the hydrophobizing process. The wafer W may be then transported through the transfer module in the shelf unit U3 and the transfer arm 15 into the liquid processing block S2.

The coating and developing apparatus 1 in the foregoing embodiment includes the liquid processing block S3 which is formed by vertically stacking the liquid processing unit blocks B1 to B5 which are respectively provided with the antireflection film-forming modules BCT, the resist film-forming modules COT, the protective film-forming modules ITC, the negative resist-developing modules NDEV and the negative resist-developing modules NDEV; and includes a heating processing clock S4 which is formed by vertically stacking the heating modules and which is located laterally adjacent to the liquid processing block S3: In addition, in each of the liquid processing unit blocks B1 to B5, liquid processing modules of the same type face across the transport region R1. Thus, the footprint of the liquid processing block S3 can be reduced; decrease in the throughput can be suppressed, because, even if one of the liquid processing modules becomes unusable, the other liquid processing module(s) can be used to process the subsequent wafers W. Moreover, the coating and developing apparatus 1 in the foregoing embodiment includes the negative resist-developing modules NDEV and the positive developing modules DEV and thus can deal with formation of both negative and positive resist patterns, resulting in cost reduction and efficient use of the floor area of the factory.

Second Embodiment

Figure 16:
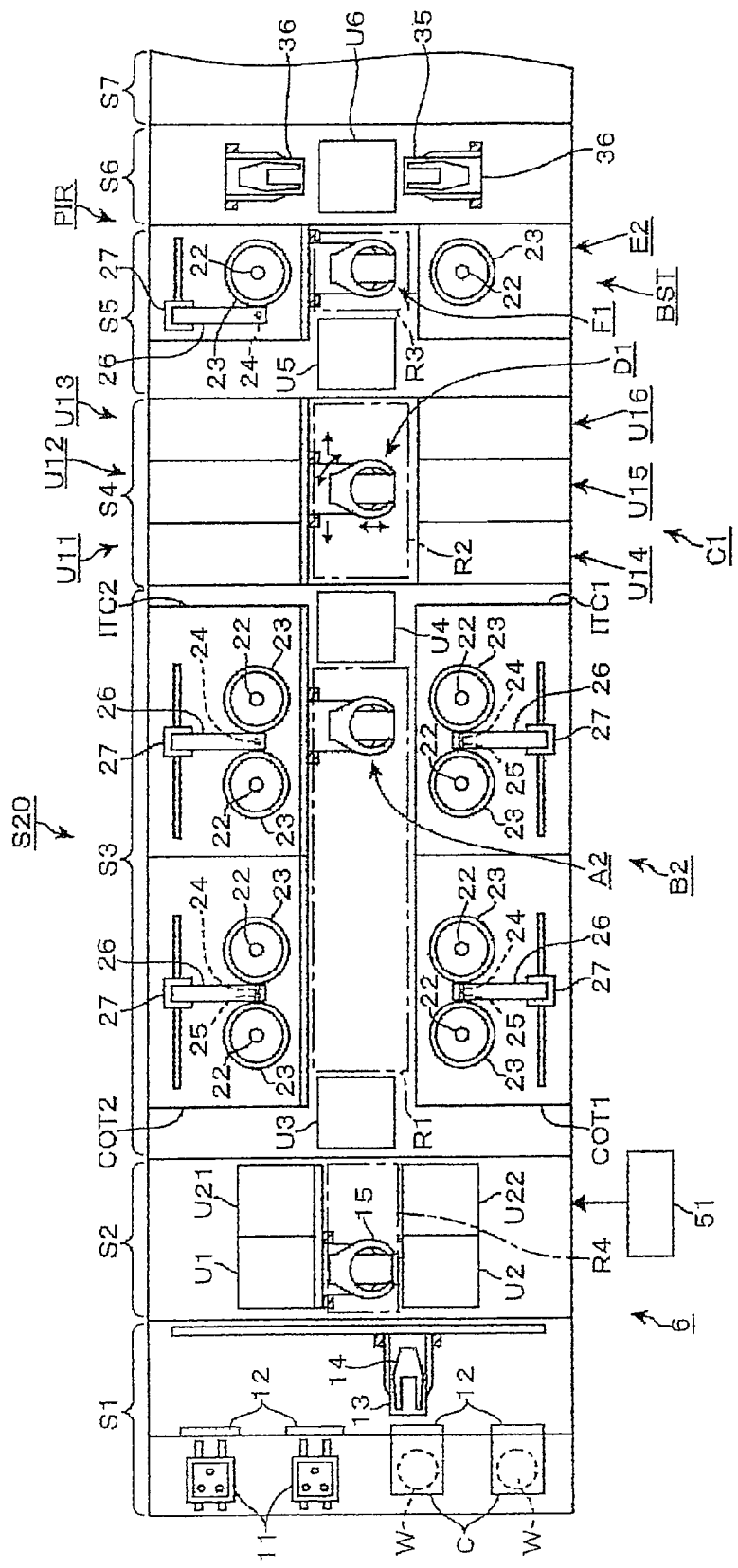
FIG. 16 is a plan view of a coating and developing apparatus in a second embodiment.
Figure 17:
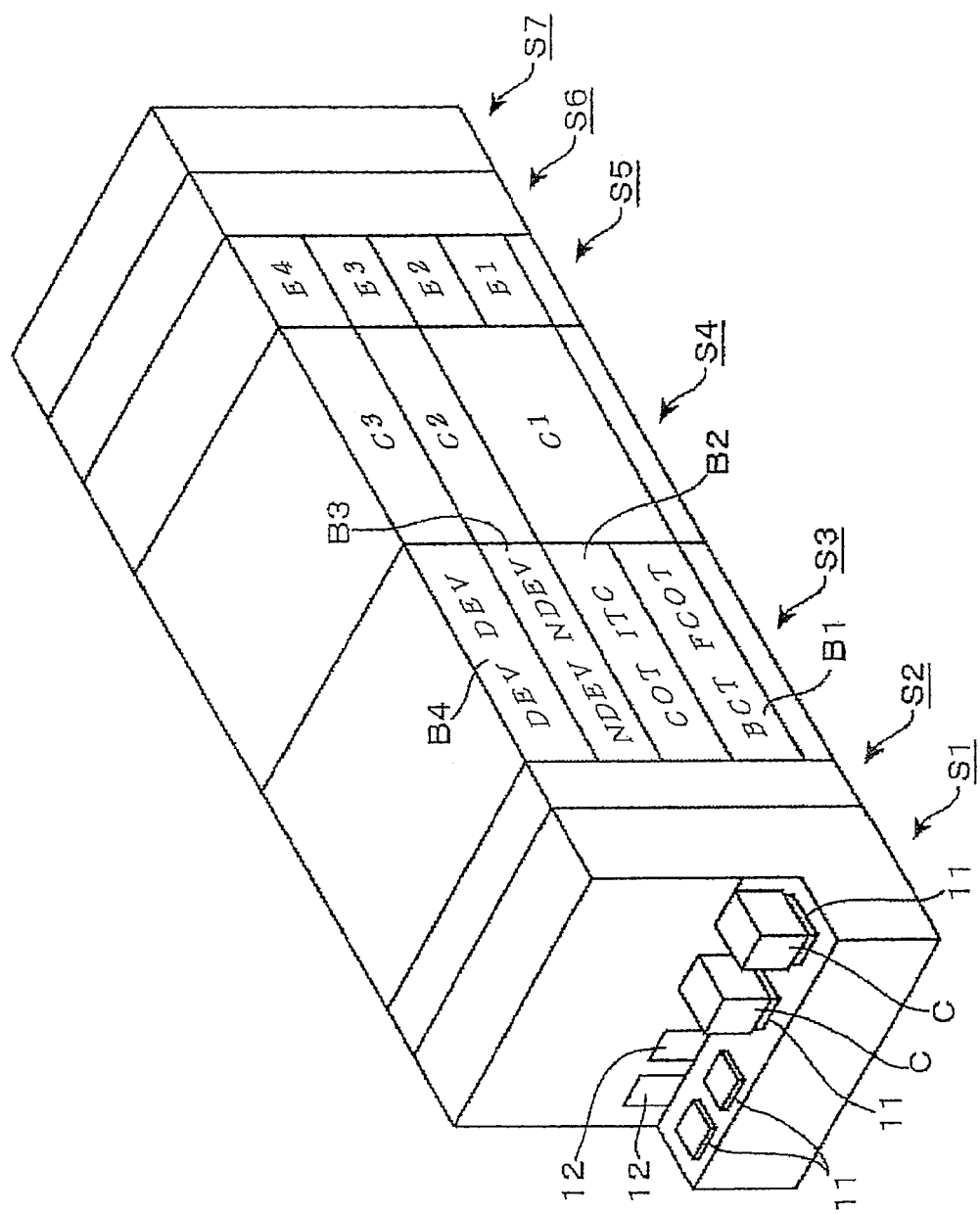
FIG. 17 is a perspective view of the coating and developing apparatus in the second embodiment.
Figure 18:
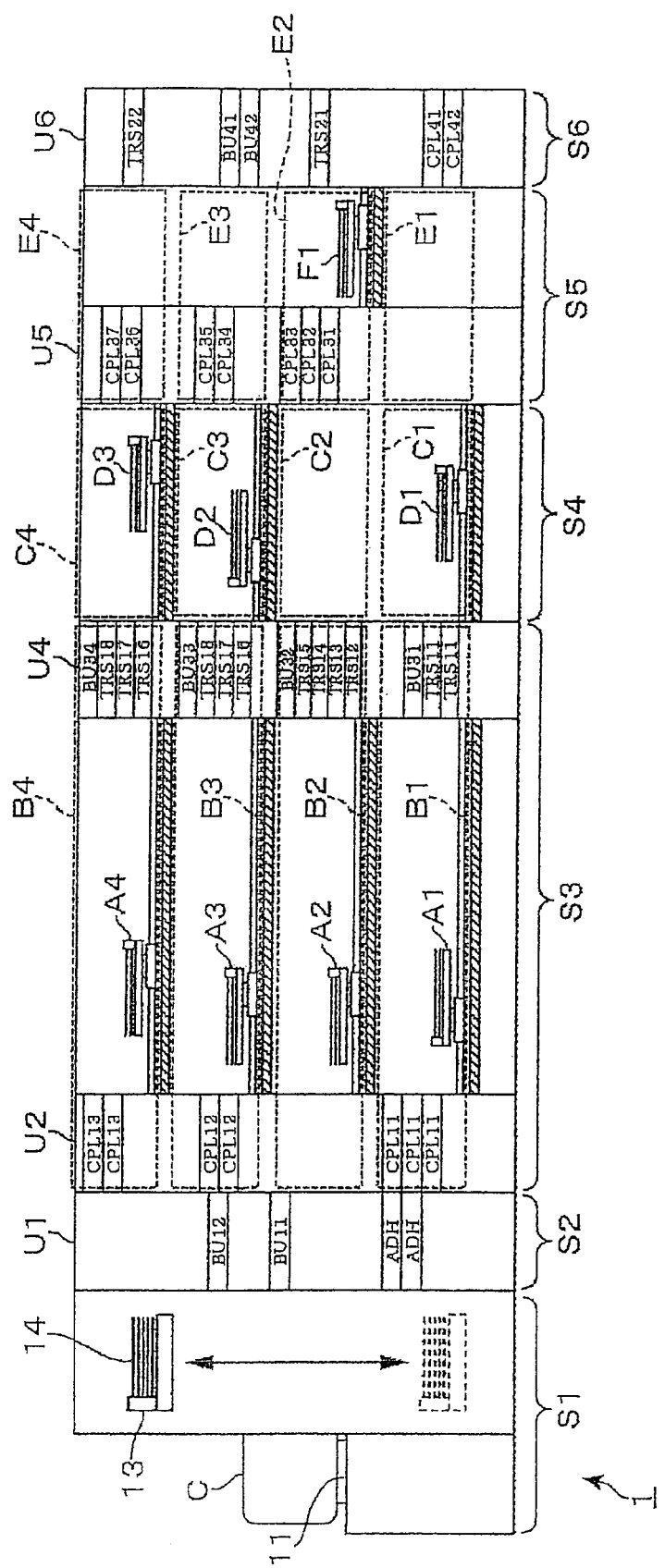
FIG. 18 is a vertical sectional side view of the coating and developing apparatus in the second embodiment.
Figure 19:
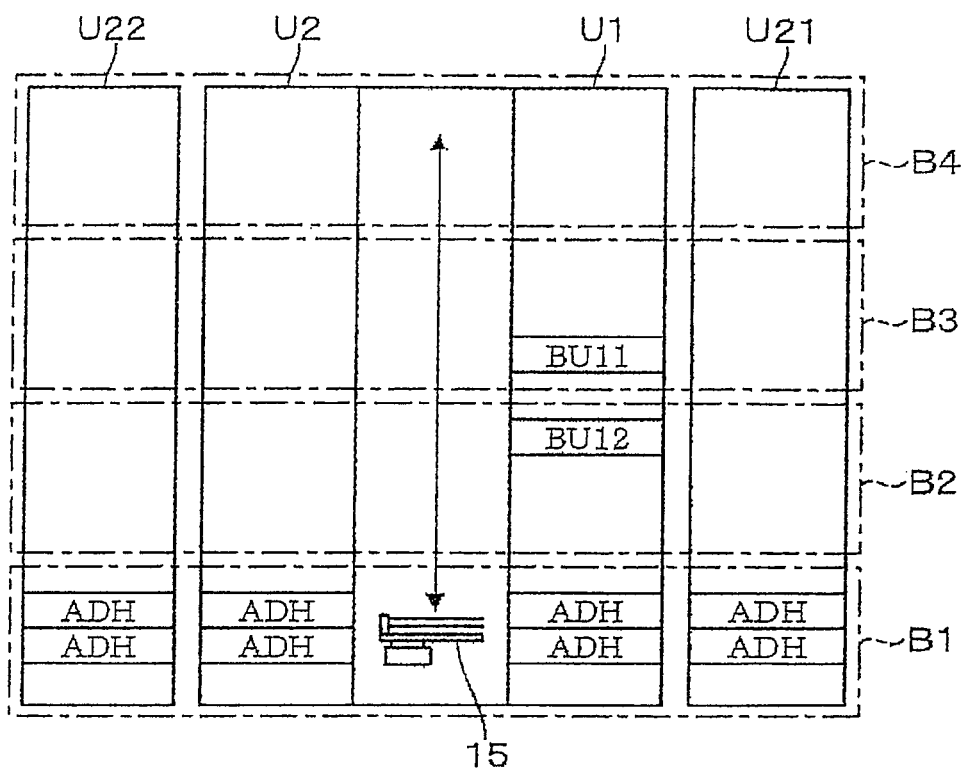
FIG. 19 is a vertical sectional side view of the anterior processing block of the coating and developing apparatus in the second embodiment.

Next, a coating and developing apparatus 6 in a second embodiment will be described, focusing on the differences from the coating and developing apparatus 1. FIGS. 16, 17 and 18 are a plan view of the coating and developing apparatus 6, a perspective view thereof, and a vertical sectional side view thereof, respectively. As shown in FIG. 16, disposed in the anterior processing block S2 are a shelf unit U21 and a shelf unit U22 on the posterior side of the shelf unit U1 and the shelf unit U2, respectively. The space between the shelf unit U1 and the shelf unit U2, and the space between the shelf unit U21 and the shelf unit U22, provide a transport region R4 extending in the anteroposterior direction. The transfer arm 15 moves along the transport region R4 so as to transport wafers W to respective modules in the shelf units U1, U2, U21 and U22. FIG. 19 is a front view of the anterior processing block S2. Note that, for the convenience of the drawing making, the shelf units U21 and U22 are illustrated outside the shelf units U1 and U2. The hydrophobizing modules ADH are provided in the shelf units U21 and U22, like the shelf units U1 and U2.

Figure 20:
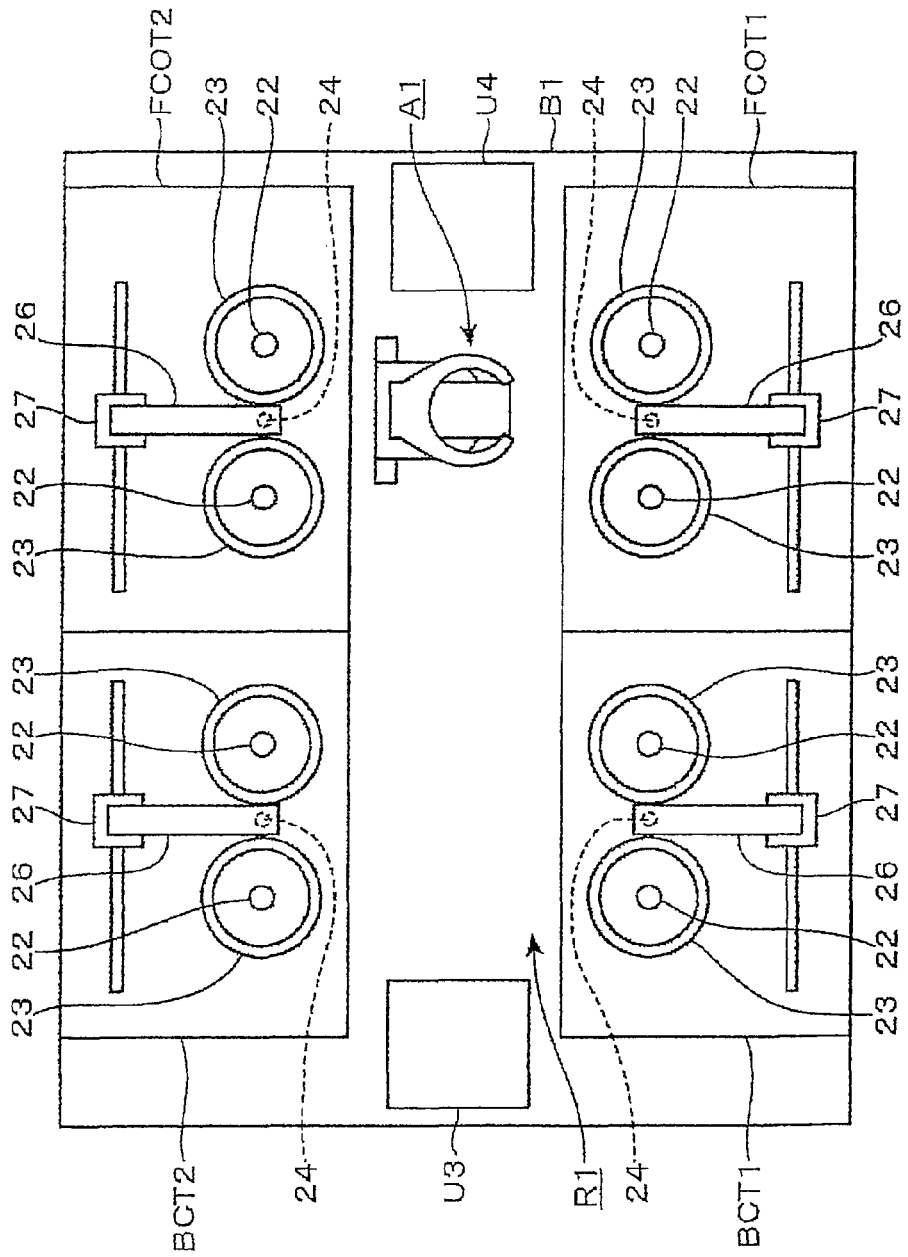
FIG. 20 is a top plan view of the liquid processing block of the coating and developing apparatus in the second embodiment.

In each of the liquid processing unit blocks B1, B2, B3 and B4 constituting the liquid processing block S3, two pairs of liquid processing modules of the same kind are disposed so as to oppose each other, on the right side and the left side of the transport region R1, respectively. The respective liquid processing modules are arranged along the transport region R1. FIG. 20 is a top plan view of the first liquid processing unit block B1. The antireflection film-forming modules BCT1 and BCT2 are disposed on the carrier block S1 side, while hardening modules FCOT1 and FCOT2 are disposed on the interface block S6 side. The hardening module FCOT has the same mechanical structure as the resist film-forming module COT, but is configured to supply a hardening liquid instead of a resist liquid. When the hardening liquid is supplied to a resist film in which a resist pattern is formed, the resist pattern hardens, so that the resist pattern becomes insoluble in a solvent contained in a resist liquid.

Figure 21:
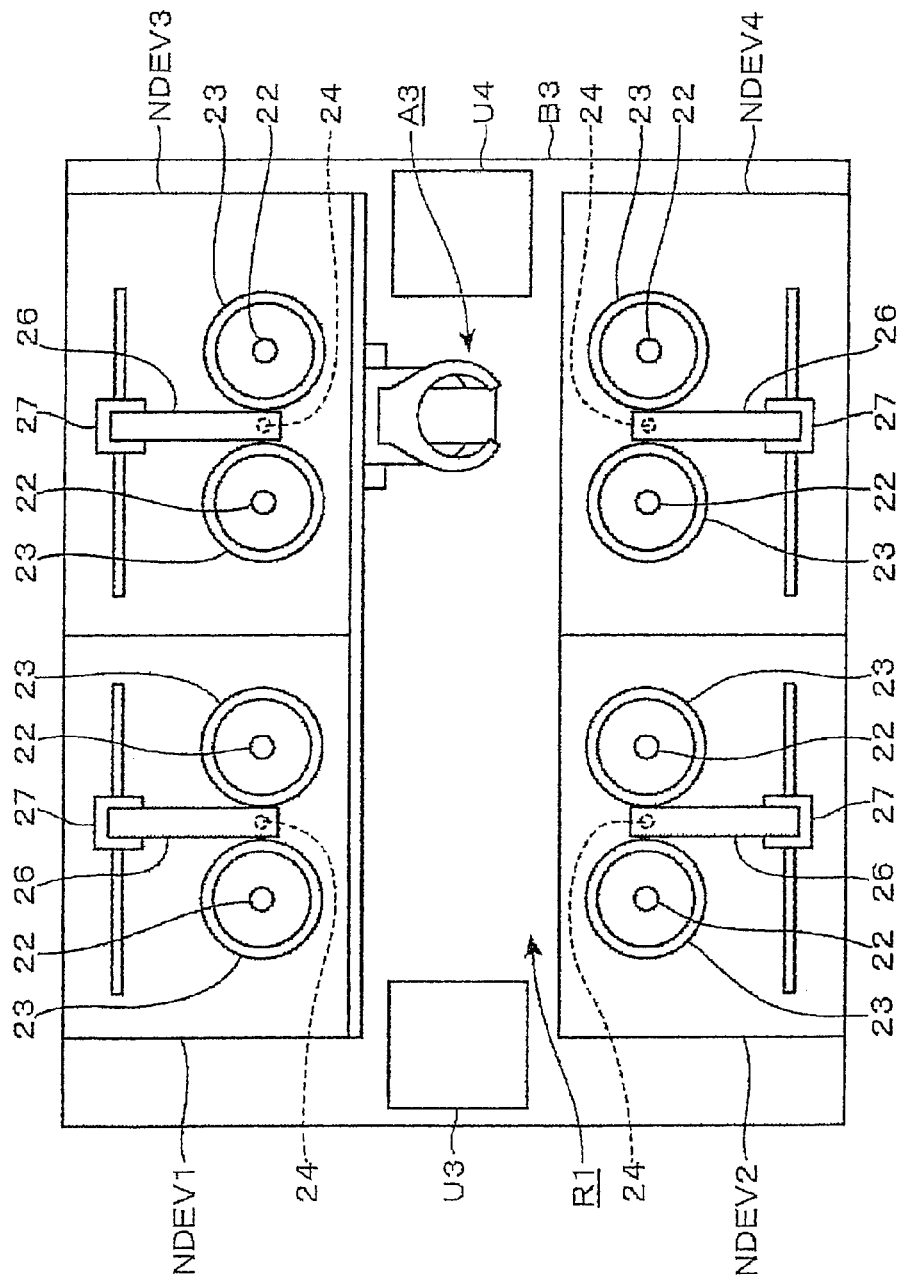
FIG. 21 is a top plan view of the liquid processing block of the coating and developing apparatus in the second embodiment.
Figure 22:
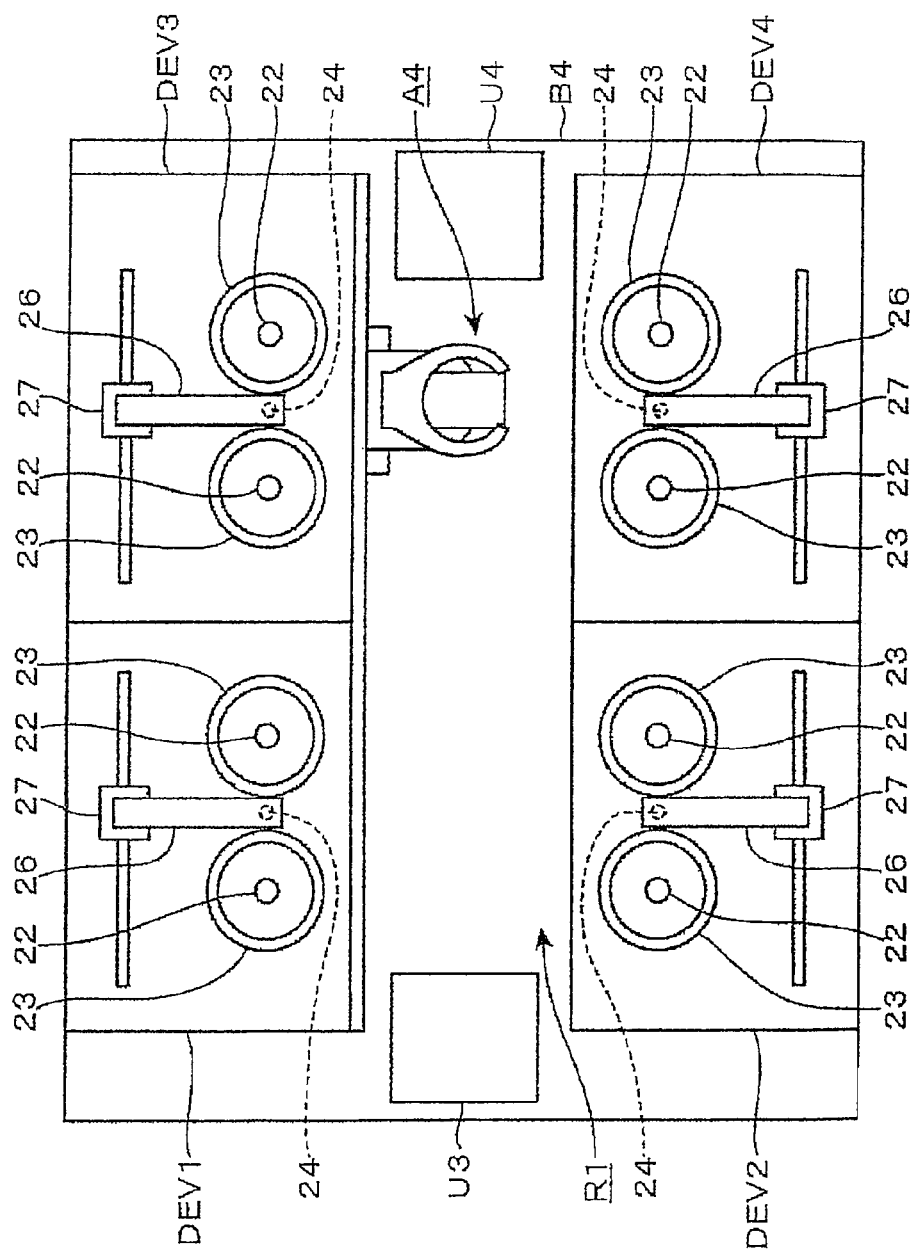
FIG. 22 is a top plan view of the liquid processing block of the coating and developing apparatus in the second embodiment.

As shown in FIG. 16, in the second liquid processing unit block B2, the resist film-forming modules COT1 and COT2 are disposed on the carrier block S1 side. The protective film-forming modules ITC1 and ITC2 are disposed on the interface block S6 side. FIG. 21 is a top plan view of the third liquid processing block S3. In the third liquid processing unit block B3, the negative resist-developing modules NDEV1 and NDEV2 are disposed on the carrier block S1 side so as to oppose each other, and the negative resist-developing modules NDEV3 and NDEV4 are disposed on the interface block S6 side. FIG. 22 is a top plan view of the fourth liquid processing unit block B4. The developing modules DEV1 and DEV2 are disposed on the carrier block S1 side, and the developing modules DEV3 and DEV4 are disposed on the interface block S6 side.

The heating processing block S4 of the coating and developing apparatus 6 has essentially the same mechanical structure as that in the first embodiment. The main arm D1 can transfer a wafer W to and from the transfer modules provided in height positions corresponding to the liquid processing unit blocks B1 and B2 in the shelf unit U4. The main arms D2 and D3 can transfer a wafer W to and from the transfer modules provided in height positions corresponding to the liquid processing unit blocks B3 and B4 in the shelf unit U4.

The auxiliary block S5 is composed of auxiliary processing unit blocks E1, E2, E3 and E4, by which a main arm F1 is shared. In each of the unit blocks E1 to E4, the back surface cleaning module BST and the post-exposure cleaning modules PIR are disposed so as to oppose each other across the transport region R3. Different from the back surface cleaning module BST in the first embodiment, the back surface cleaning module BST provided in the coating and developing apparatus 6 has one spin chuck 22 and one processing cup 23.

Like the first embodiment, the user can select one of the negative development processing mode and the positive development processing mode by the mode selection unit 56 of the controller 51. In the second embodiment, in both of a case where the negative development processing mode is selected and a case where the positive development processing mode is selected, the lattice-like resist pattern of holes, which has been described in the above first embodiment, can be formed.

Figure 23:
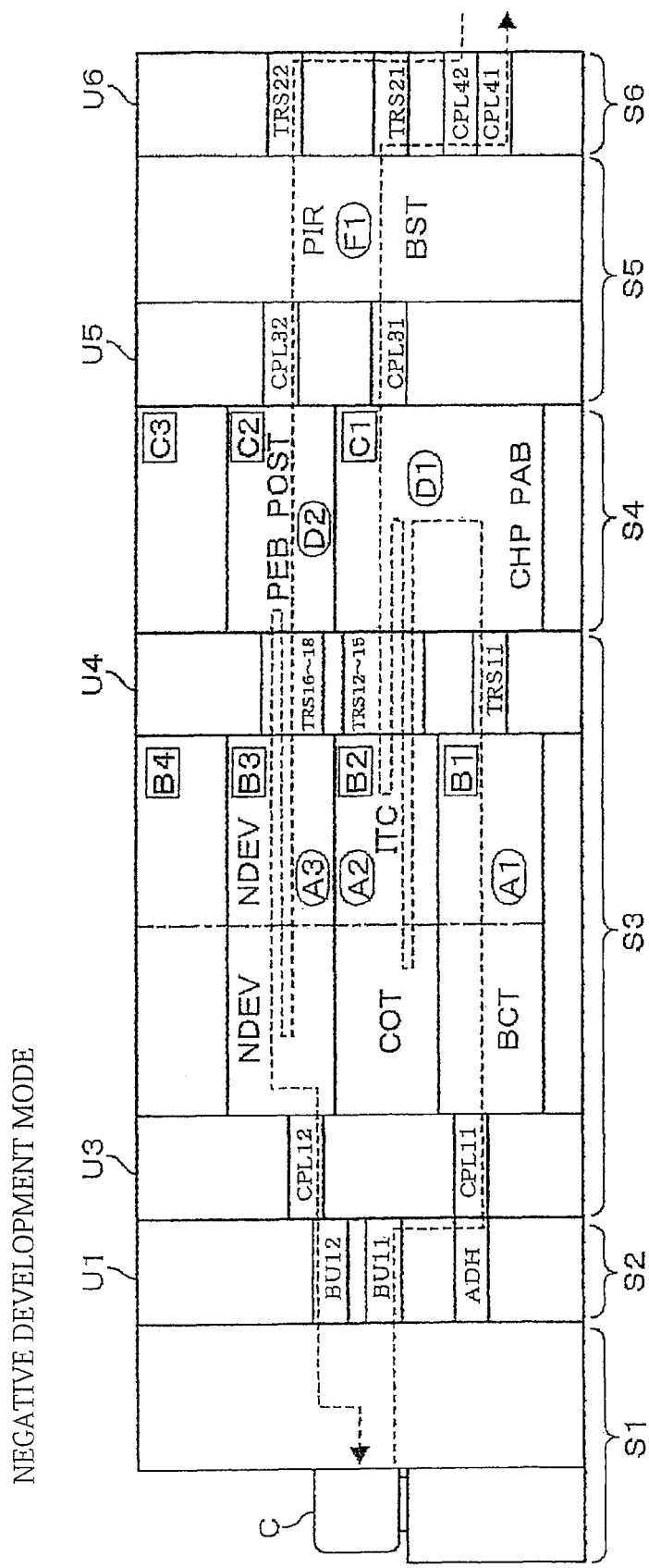
FIG. 23 is a flow diagram illustrating a wafer transport route in the coating and developing apparatus in the second embodiment.

The wafer transport route, when the negative development processing mode is carried out, will be described with reference to FIG. 23. From the carrier C, a wafer W is transported, in the following order, to the transfer arm 13→the transfer module BU11 of the shelf unit U1→the hydrophobizing module ADH of the shelf unit U1, U2, U21 or U22→the transfer arm 15→the transfer module CPL11→the main arm A1→the antireflection film-forming module BCT1 or BCT2→the main arm A1→the transfer module TRS11→the main arm D1→the heating module CHP→the main arm D1→the transfer module TRS12→the main arm A2→the resist film-forming unit COT1 or COT2 in which a negative resist film is formed on the wafer W.

Subsequently, the wafer W is transferred, in the following order, to the main arm A2→the transfer module TRS13→the main arm D1→the heating module PAB→the main arm D1→the transfer module TRS14→the main arm A2→the protective film-forming unit ITC1 or ITC2→the main arm A2→the transfer module TRS15→the main arm D1→the heating module CHP→the transfer module CPL31→the main arm F1→the back surface cleaning module BST→the main arm F1. After that, in the same manner as the first embodiment, the wafer W is loaded into the exposure apparatus S7 via the interface block S6, and is subjected to immersion exposure similarly to when the negative development processing mode is performed in the first embodiment.

After immersion exposure, like the first embodiment, the wafer W is transferred from the interface block S6 to the main arm F1, from which the wafer W is transferred, in the following order to, the post-exposure cleaning module PIR→the transfer module CPL32→the main arm D2→the heating module PEB→the main arm D2→the transfer module TRS16→the main arm A3→the negative resist-developing modules NDEV1, NDEV2, NDEV3 or NDEV4 in which the wafer W is subjected to developing processing. Then, the wafer W is transported, in the following order, to the main arm A3→the transfer module TRS17→the main arm D2→the heating module POST→the main arm D2→the transfer module TRS18→the main arm A3→the transfer module CPL12. Thereafter, the wafer W is returned to the carrier C, like the first embodiment.

Figure 24:
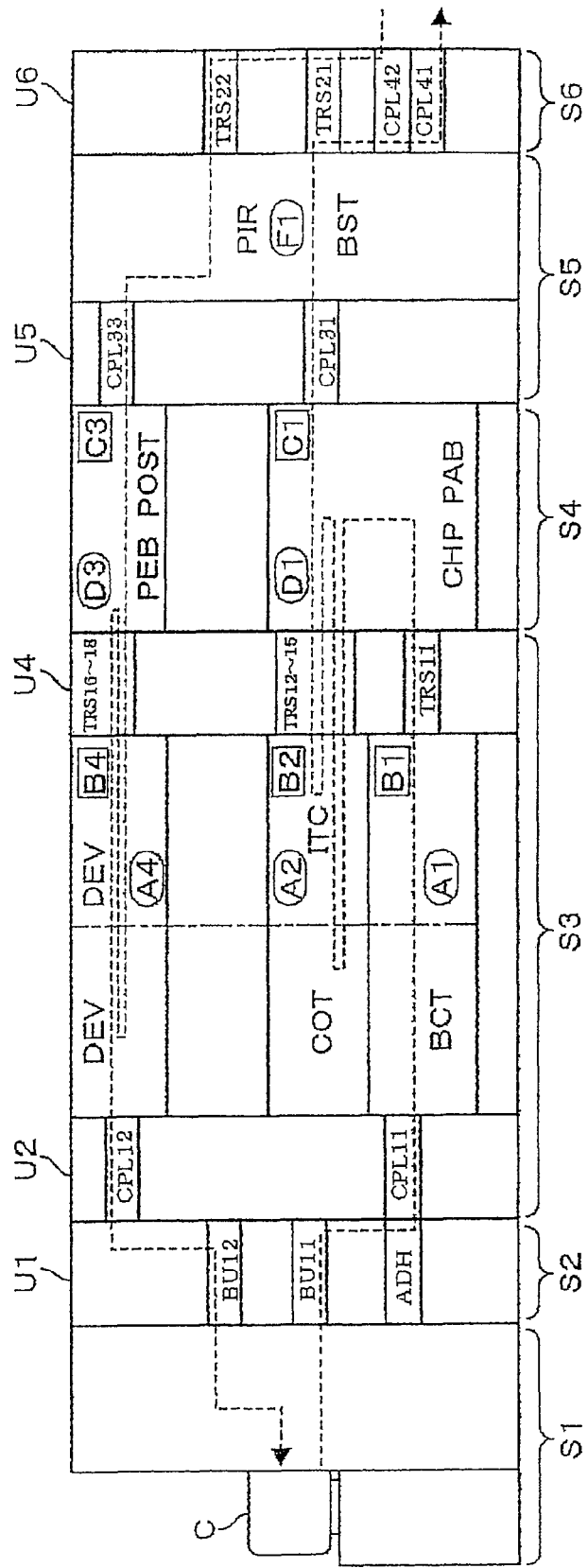
FIG. 24 is a flow diagram illustrating a wafer transport route in the coating and developing apparatus in the second embodiment.
Figure 25:
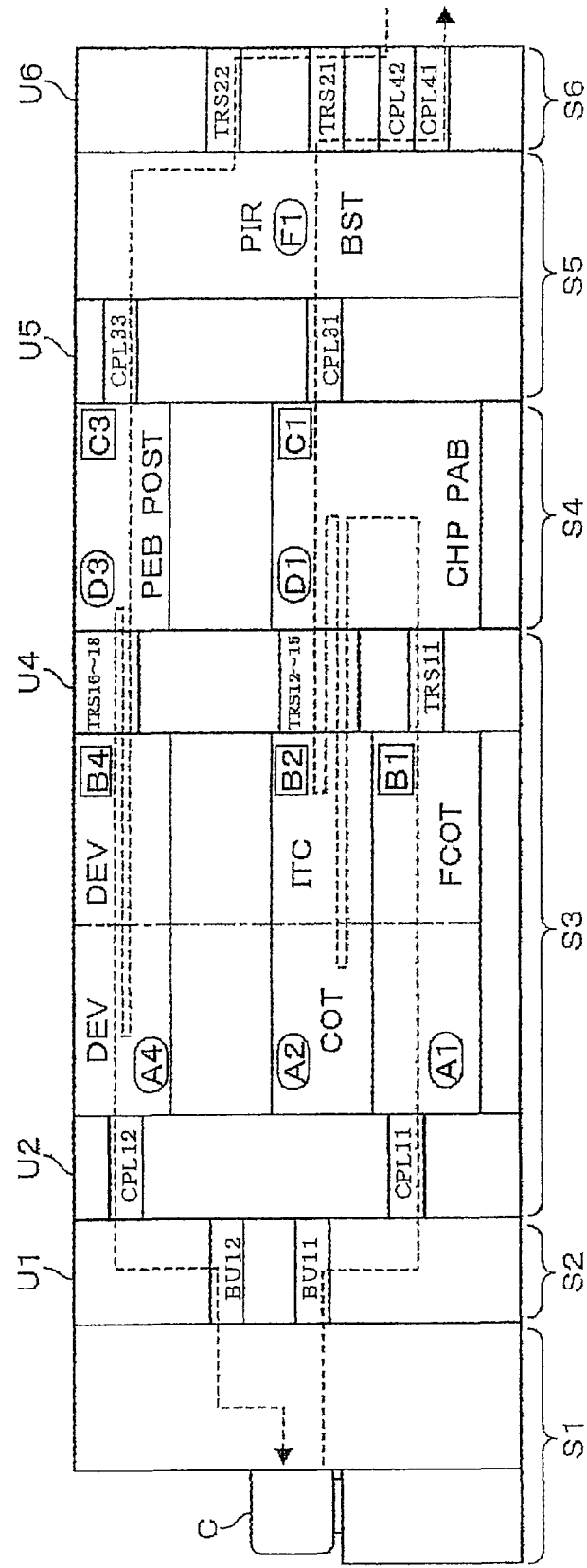
FIG. 25 is a flow diagram illustrating a wafer transport route in the coating and developing apparatus in the second embodiment.
Figure 26:
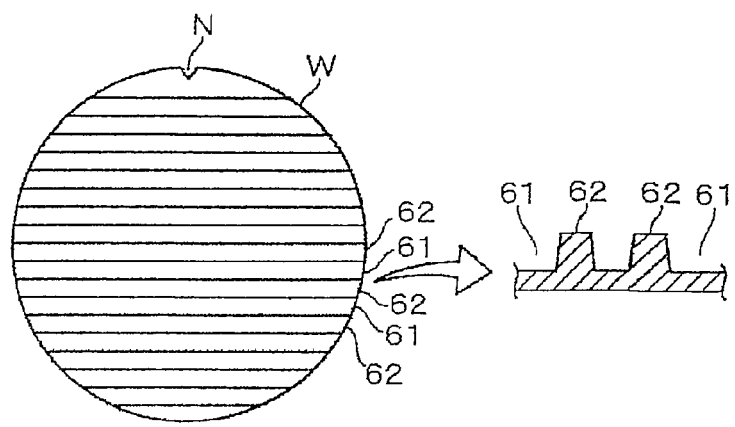
FIG. 26 is a plan view of a wafer processed by the coating and developing apparatus in the second embodiment.
Figure 27:
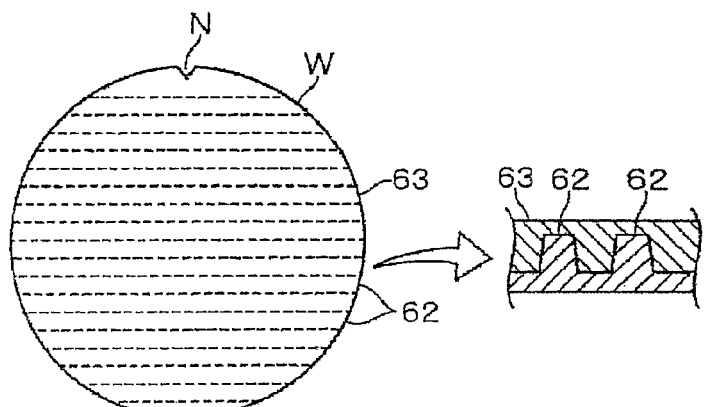
FIG. 27 is a plan view of a wafer processed by the coating and developing apparatus in the second embodiment.
Figure 28:
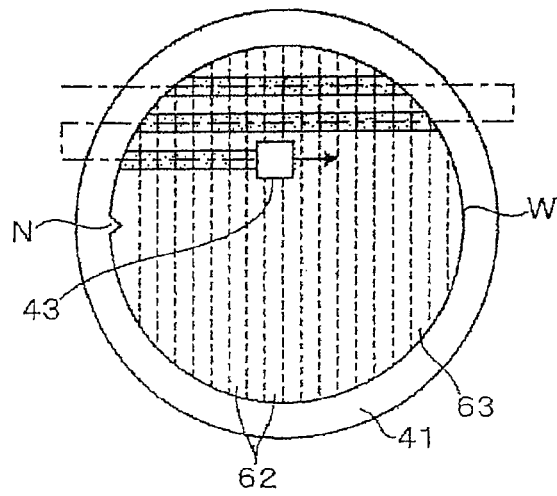
FIG. 28 is a plan view of a wafer processed by the coating and developing apparatus in the second embodiment.
Figure 29:
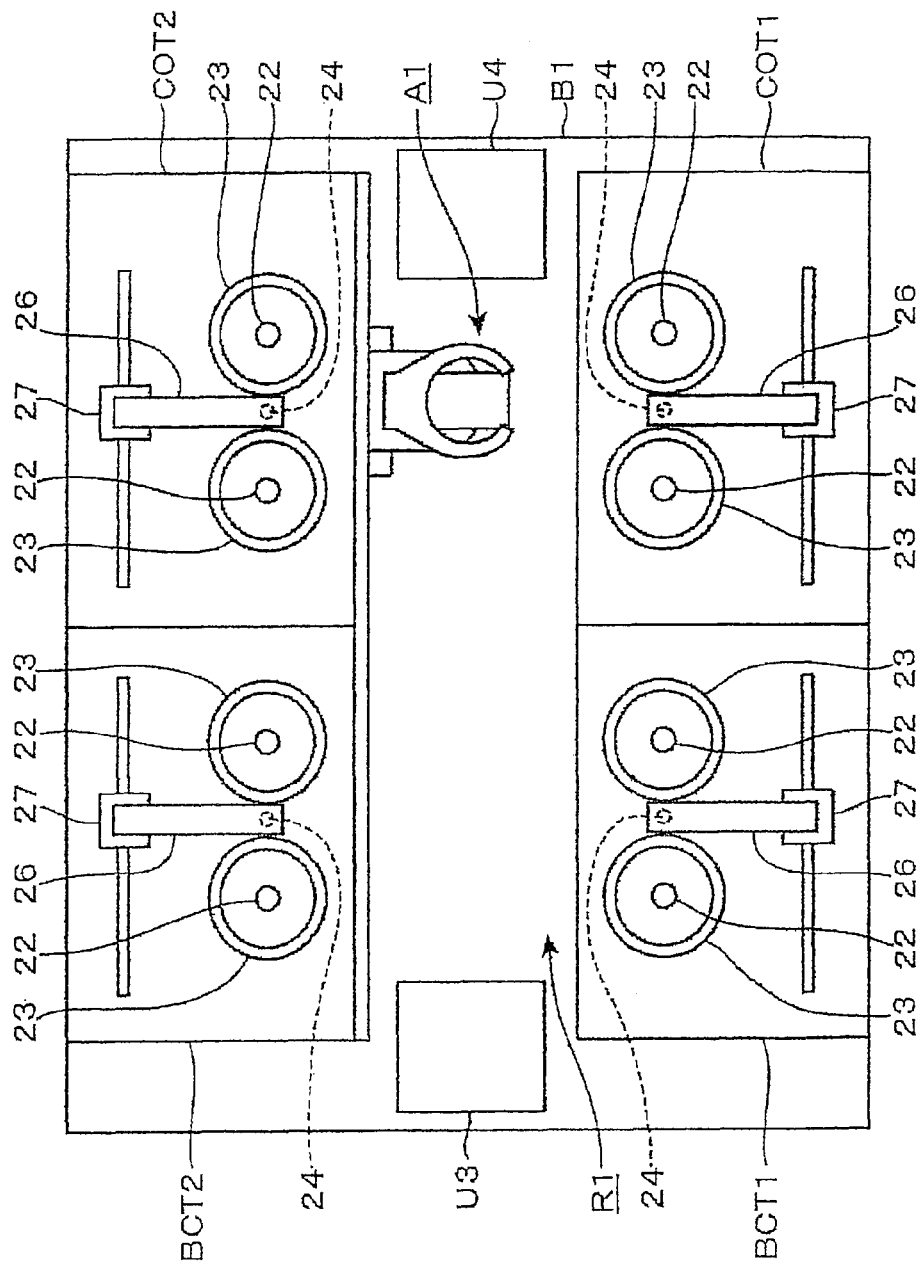
FIG. 29 is a top plan view of the liquid processing block of the coating and developing apparatus in one modification of the second embodiment.
Figure 30:
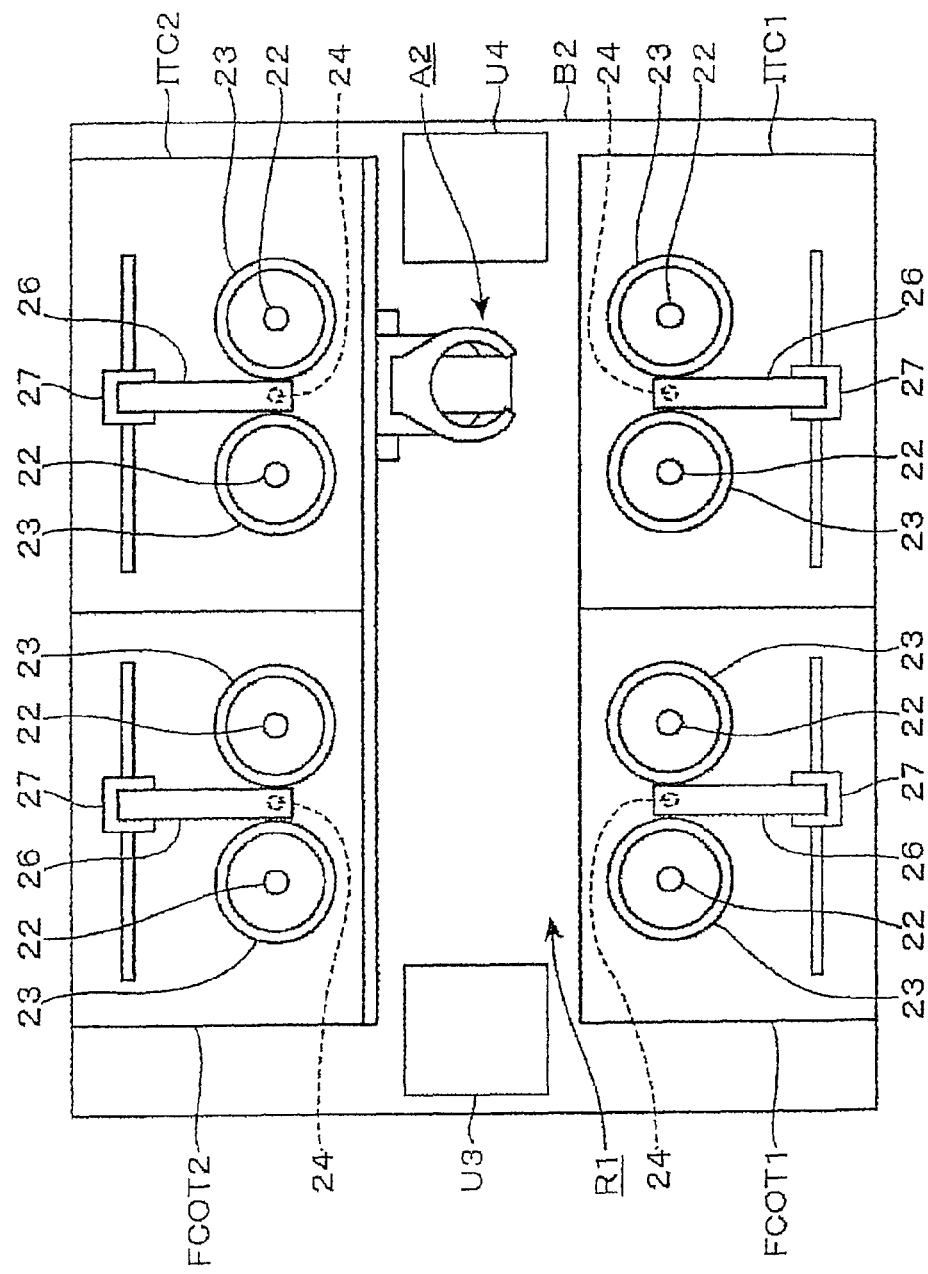
FIG. 30 is a top plan view of the liquid processing block of the coating and developing apparatus in one modification of the second embodiment.

Next, the wafer transfer route, when the positive developing process is carried out, will be described with reference to FIGS. 24 and 25, focusing on the differences from the foregoing negative developing process. In the positive developing process, a wafer W taken out from the carrier C is subjected to a first resist pattern formation, and the wafer W is returned to the carrier C. After that, the wafer W is subjected to a second resist pattern formation, and is again returned to the carrier C. FIG. 24 shows the transport route upon the first resist pattern formation and the modules used therefor, and FIG. 25 shows the transport route upon the second resist pattern formation and the modules used therefor. FIGS. 26 to 28 show the surface of a wafer W during processing, and description is made suitably referring to FIGS. 26 to 28.

As shown in FIG. 24, a wafer W is transported from the carrier C to the exposure apparatus S7 along the same route as the route when the negative developing process is performed, and is processed in the respective modules. However, in the resist film-forming module COT1 or COT2, a positive resist is applied onto the wafer W instead of a negative resist. In the exposure apparatus S7, a striped-pattern exposed area is formed similarly to when the negative development processing mode is performed in the first embodiment.

The wafer W after exposure is transported, from the exposure apparatus S7, in the following order, to the main arm F1→the post-exposure cleaning module PIR→the main arm F1→the transfer module CPL33→the main arm D3→the heating module PEB→the transfer module TRS16→the main arm A4→the developing module DEV in which the wafer is developed. Thus, the exposed area is dissolved whereby a resist pattern is formed. FIG. 26 shows the resist pattern in which recesses of the pattern are denoted by reference numeral 61 and projections thereof are denoted by reference numeral 62. A vertical side section of the resist pattern is indicated by the arrow. After the resist pattern has been formed, the wafer W is transported, in the following order, to the main arm A4→the transfer module TRS17→the heating module POST→the transfer module TRS18→the main arm A4→the transfer module CPL12. Thereafter, the wafer is returned to the carrier C like the first embodiment, and the first resist pattern formation is finished.

Subsequently, the wafer W is again taken out from the carrier C to the transfer module BU11, and the second resist pattern formation is started as shown in FIG. 25. The wafer W is transported, in the following order, to the transfer arm 15→the transfer module CPL11→the hardening module FCOT1 or FCOT2→the main arm D1→the heating module CHP in which the pattern is hardened. Then, the wafer W is transported to the resist film-forming module COT1 or COT2 in which a positive resist is supplied to the wafer W, like the first resist pattern formation. As shown in FIG. 27, the recesses 61 are filled with the newly supplied resist 63. Thereafter, the wafer W is transported along the same route as the first resist pattern formation. After a protective film has been formed on the wafer W, the wafer W is loaded into the exposure apparatus S7. In the exposure apparatus S7, as described above, the exposure head 43 moves such that a striped-pattern exposed area is formed. In the exposure process of the second pattern formation, the orientation of the notch N in the wafer W differs from that of the exposure process of the first pattern formation by 90° (FIG. 28).

After immersion exposure, like the first pattern formation, the wafer W is transported to the developing module DEV in which an area 64 that has been exposed in the second pattern formation dissolves in a developer. However, the projections 62, which have been formed in the first pattern formation, do not dissolve in the developer, although the projections 62 are included in the exposed area 64. Thus, holes in a lattice pattern are formed. Thereafter, the wafer W is processed similarly to the first pattern formation, and is transported among the respective modules so as to be returned to the carrier C. Also in the second embodiment, like the first embodiment, when one of the opposed liquid processing modules of the same kind fails, the wafer W can be continuously transported and processed by using the other liquid processing module.

In the second embodiment, the liquid processing block S3 is constituted by stacking the first liquid processing unit bock B1 including the antireflection film-forming modules BCT and the hardening modules FCOT, the second liquid processing unit block B2 including the resist film-forming modules COT and the protective film-forming modules ITC, the third liquid processing unit block B3 including the negative resist-developing modules NDEV, and the fourth liquid processing unit block B4 including the developing modules DEV. The heating processing block S4 in which the heating modules are stacked is laterally adjacent to the liquid processing block S3. In each of the liquid processing unit blocks B1 to B4, the liquid processing modules of the same kind oppose each other across the transport region R1. Thus, like the first embodiment, small installation area of the processing block 520 can be achieved, as well as the lowering of the throughput can be reduced. Further, in the second embodiment, whichever of the negative developing process or the positive developing process is selected by the user, a pattern of the same shape can be formed. Thus, by selecting one of the processes in consideration of properties of a resist to be used and film thicknesses of respective films, a resist pattern of an excellent shape can be formed.

Modification of Second Embodiment

The layout of the liquid processing modules in the coating and developing apparatus 6 in the second embodiment is not limited to the above example. For example, as shown in FIGS.

29 and 30, the antireflection film-forming modules BCT and the resist film-forming modules COT may be provided in the first liquid processing unit block B1, and the hardening modules FCOT and the protective film-forming modules ITC may be provided in the second liquid processing unit block B2. In this case, when the negative development processing mode is carried out, a wafer W is heated in the heating module CHP of the first heating processing unit block C1 after formation of an antireflection film. Then, the wafer W is returned to the first liquid processing unit block B1 via the transfer module TRS of the shelf unit U5, and is processed in the resist film-forming module COT. After a resist has been applied onto the wafer W, the wafer W is again loaded into the first heating processing unit block C1, and is heated in the heating module PAB. Thereafter, the wafer W is transported to the second liquid processing unit block B2 by the main arm F1 in which a protective film is formed thereon. After that, the wafer W is transported along the same transport route as the second embodiment so as to be processed.

When the positive developing process is carried out, a wafer W is transported along the same route as the aforementioned negative developing process. After a first resist pattern has been formed, the wafer W is transported, from the carrier C, in the following order, to the transfer arm 13→the transfer module BU11→the transfer arm 15→the first liquid processing, unit block B1→the first heating processing unit block C1→the second liquid processing unit block B2. The wafer W is processed by the hardening module FCOT1 or FCOT2 of the second liquid processing unit block B2.

Thereafter, the wafer W is transported to the heating module CHP of the first heating processing unit block C1 in which the wafer W is heated. Further, the wafer W is transported, in the following order, to the auxiliary block S5→the transfer module CPL42 of the interface block S6→the transfer module BU41→the third heating processing unit block C3→the fourth liquid processing unit block B4, and is returned to the carrier C. At this time, the wafer W is transported to the carrier C without being processed in the respective blocks. After that, the wafer W is again taken out from the carrier C, and is loaded into the first liquid processing unit block B1. Then, the wafer W is transported and processed in the same manner as the first resist pattern formation, so as to perform a second resist pattern formation.

In addition, the layout of the liquid processing modules of the unit block for performing development (developing unit block) is not limited to those in the above embodiments. For example, in the second embodiment, although the third liquid processing unit block C3 are provided with the developing modules DEV and the fourth liquid processing unit block C4 is provided with the negative resist-developing modules NDEV, the third and the fourth liquid processing unit blocks C3 and C4 may each include both the developing modules DEV and the negative resist-developing modules NDEV. In this case, one unit block for performing development may include at least two developing modules (positive resist-developing modules) DEV and at least two negative resist-developing modules NDEV; the two developing modules of the same type (DEV or NDEV) may be arranged on both side of the transfer passage of the unit block to face across the transfer passage, such that two different developing modules (DEV and NDEV) are arranged side by side on each side of the transfer passage. Alternatively, the two developing modules of one type (e.g., DEV) may be arranged side by side on one side of the transfer passage of the unit block, and the two developing modules of the other type (e.g., NDEV) may be arranged side by side on the other side of the transfer passage, such that two different developing modules (DEV and NDEV) are arranged to face across the transfer passage. Further, like the first embodiment, the main arm of the third liquid processing unit block C3 for performing developing processing or the main arm of the fourth liquid processing unit block C4 for performing developing processing may be shared by these liquid processing unit blocks C3 and C4. Furthermore, in the respective embodiments, the liquid processing unit blocks including the developing modules DEV and the negative resist-developing modules NDEV may be located below the liquid processing unit bock including the other liquid processing modules.

Figure 31:
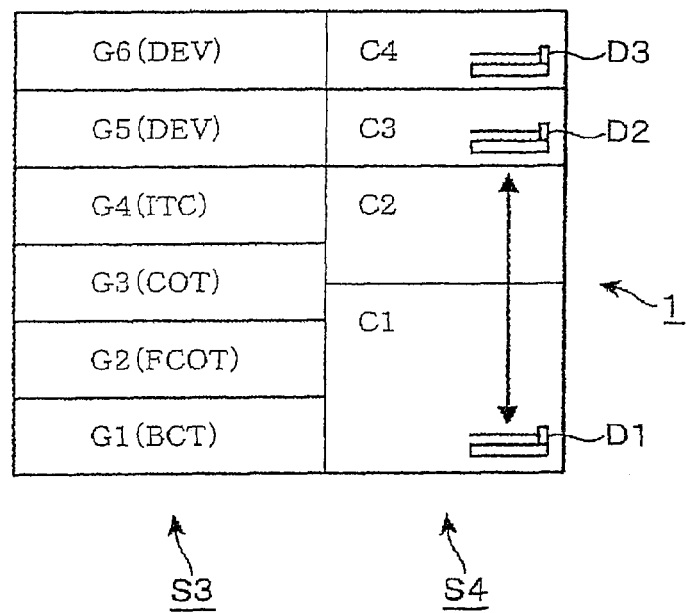
FIG. 31 is schematic diagram showing one modification of the first embodiment in which hardening modules are provided.

The hardening module FCOT provided in the coating and developing apparatus 6 in the second embodiment may be applied to the coating and developing apparatus 1 in the first embodiment. FIG. 31 is schematic diagram showing the coating and developing apparatus 1 including the hardening modules FCOT so as to form the lattice-like pattern of holes. The liquid processing block S3 of the coating and developing apparatus 1 is composed of liquid processing unit block G1, G2, G3, C4, G5 and G6, which are stacked in that order from the bottom. The liquid processing unit blocks G1, G3 and G4 have the same mechanical structure as the liquid processing unit blocks B1, B2 and B3 in the first embodiment, respectively. The liquid processing unit blocks G5 and G6 have the same structural features as the liquid processing unit blocks B4 and B5 in the first embodiment except that the former have the developing modules DEV instead of the negative resist-developing modules NDEV of the latter. In addition, the liquid processing unit block G2 has the same structural features as the liquid processing unit block B1 except that the former has the liquid processing modules FCOT.

In this modification, the main arm D1 disposed in the heating processing unit blocks C1 and C2 can access the transfer modules provided in height positions corresponding to the liquid processing unit blocks G1, G2, G3 and G4. Thus, a wafer W can be transferred between the liquid processing unit blocks G1 to G4 and the heating processing unit blocks C1 and C2. In the first resist pattern formation, after a wafer W has been sequentially transported to the liquid processing unit blocks G1, G3 and G4 so as to be processed, the wafer W is transported to the liquid processing unit block G5 or G6 so as to be processed. Then, in the second resist pattern formation, after the wafer W has been sequentially transported to the liquid processing unit blocks G2, G3 and G4 so as to be processed, the wafer W is transported to the liquid processing unit block G5 or G6 so as to be processed.

Figure 32:
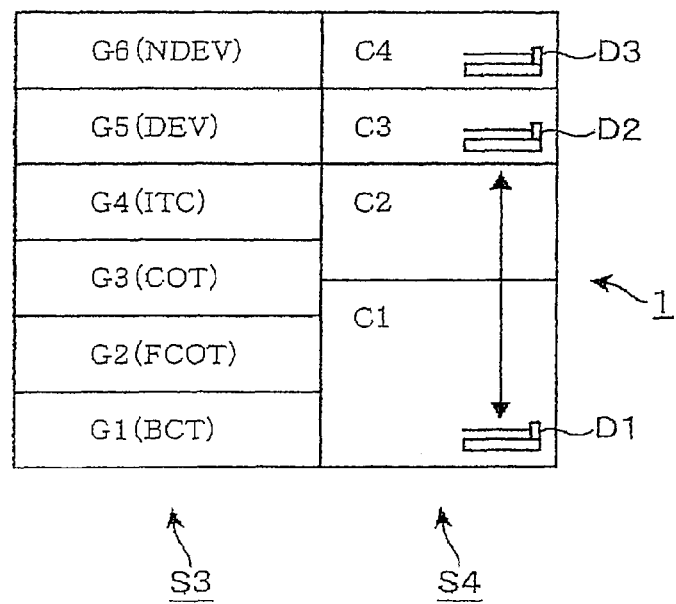
FIG. 32 is schematic diagram showing one modification of the first, embodiment in which hardening modules are provided.

FIG. 32 shows another modification in which the hardening module FCOT is applied to the first embodiment. The liquid processing unit block G6 of the liquid processing block S3 shown herein is provided with the negative resist-developing modules NDEV as liquid processing modules. Except for this difference, the liquid processing block 83 shown in FIG. 32 has the same mechanical structure as the liquid processing block shown in FIG. 31. The coating and developing apparatus 1 including such a liquid, processing unit block S3 can also perform the negative development processing mode and the positive development processing mode in a switching manner, and can form a resist pattern in which a number of holes are arranged in a lattice pattern in the respective developing modes, like the second embodiment. In the above respective embodiments, the protective film-forming module ITC may supply a chemical liquid for forming an antireflection film, instead of a chemical liquid for forming a protective film, so as to form the antireflection film. However, in this case, unlike the positive development processing mode in the second embodiment, the process for repeatedly form resist patterns on one wafer W is not performed.

In the above respective embodiment, although the unit blocks for developing are stacked in two layers, the unit blocks for developing may be stacked in three or more layers, or in only a single layer. Even when the main arm A is shared by the unit blocks for developing as in the first embodiment, as long as the unit block B has a height corresponding to heights of the two other unit blocks B, the unit block B is deemed as a two-layered unit block.

The invention claimed is:

1. A coating and developing apparatus comprising a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein:
(a) the processing block includes a liquid processing block disposed on a carrier block side and a heating processing block disposed on an interface block side, the liquid processing block comprising a stack of a liquid processing unit blocks;
(b) the liquid processing unit blocks includes a first unit block, a second unit block and one or more of developing unit blocks, said one or more developing unit blocks overlying or underlying a stack of the first unit block and the second unit block, the second unit block overlying the first unit block;
(c, d) said coating and developing apparatus has one of a combination of the features (c1) and (d1) or a combination of the features (c2) and (d2):
(c1) the first unit block includes: a transport passage extending linearly from the carrier block side to the interface block side; antireflection film-forming modules disposed on both sides of the transport passage each for supplying a chemical liquid onto the substrate to form thereon an antireflection film; resist film-forming modules disposed on both sides of the transport passage each for supplying a chemical liquid, comprising a resist liquid, onto the antireflection film to form a resist film on the antireflection film; a main transfer mechanism that moves along the transport passage to transport the substrate to and from the antireflection film-forming modules and the resist film-forming modules;
(d1) the second unit block includes: a transport passage extending linearly from the carrier block side to the interface block side; upper film-forming modules disposed on both sides of the transport passage each for supplying a chemical liquid onto the resist film to form an upper film on the substrate; hardening modules disposed on both sides of the transport passage each for supplying a hardening liquid onto a patterned resist film, having been exposed and developed, to harden the patterned resist film; and a main transfer mechanism that moves along the transport passage to transport the substrate to and from the upper film-forming modules and the hardening modules;
(c2) the first unit block includes: a transport passage extending linearly from the carrier block side to the interface block side; antireflection film-forming modules disposed on both sides of the transport passage each for supplying a chemical liquid onto the substrate to form thereon an antireflection film; hardening modules disposed on both sides of the transport passage each for supplying a hardening liquid onto a patterned resist film, having been exposed and developed, to harden the patterned resist film; a main transfer mechanism that moves along the transport passage to transport the substrate to and from the antireflection film-forming modules and the hardening modules;
(d2) the second unit block includes: a transport passage extending linearly from the carrier block side to the interface block side; upper film-forming modules disposed on both sides of the transport passage each for supplying a chemical liquid onto the resist film to form an upper film on the substrate; resist film-forming modules disposed on both sides of the transport passage each for supplying a chemical liquid, comprising a resist liquid, onto the antireflection film to form a resist film on the antireflection film; and a main transfer mechanism that moves along the transport passage to transport the substrate to and from the upper film-forming modules and the resist film-forming modules;
(e) each of said one or more developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;
(f) the heating processing block includes: a stack of heating modules including first heating modules assigned to the first and second unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules;
(g) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block;
(h) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block; and
(i) a transfer mechanism is provided to transfer a substrate, removed from a carrier placed in the carrier block, to the transfer stage on the carrier block side associated with the first unit block, and receive a substrate from the transfer stage on the carrier block side associated with each of said one or more developing unit blocks.

2. The coating and developing apparatus according to claim 1, wherein said coating and developing apparatus has the combination of the features (c1) and (d1).

3. The coating and developing apparatus according to claim 1, wherein said coating and developing apparatus has the combination of the features (c2) and (d2).

4. The coating and developing apparatus according to claim 1, the developing modules included in said one or more developing unit blocks include positive resist-developing modules for developing a positive resist and negative resist-developing modules for developing a negative resist.

5. The coating and developing apparatus according to claim 1, further comprising a mode selection unit for selecting one of modes including: a first mode in which, after formation of a first resist pattern on the substrate, the first resist is hardened by using the hardening module, and thereafter a second resist pattern is formed on the substrate; and a second mode, in which a resist pattern is formed by using the negative resist-developing module.

6. The coating and developing apparatus according to claim 1, wherein, said coating and developing apparatus includes two developing unit blocks, one being a. positive resist-developing unit block exclusively for developing a positive resist and having the positive resist-developing modules disposed on both sides of the associated transport passage, and the other being a negative resist-developing unit block exclusively for developing a negative resist having the negative resist-developing modules disposed on both sides of the associated transport passage.

7. A coating and developing apparatus comprising a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block,
wherein:
(a) the processing block includes a liquid processing block disposed on a carrier block side and a heating processing block disposed on an interface block side, the liquid processing block comprising a stack of a liquid processing unit blocks;
(b) the liquid processing unit blocks includes a first unit block, a second unit block and one or more developing unit blocks, said one or more developing unit blocks overlying or underlying a stack of the first unit block and the second unit block, the second unit block overlying the first unit block;
(c) the first unit block includes: a transport passage extending linearly from the carrier block side to the interface block side; antireflection film-forming modules disposed on both sides of the transport passage each for supplying a chemical liquid onto the substrate to form thereon an antireflection film; and a main transfer mechanism that moves along the transport passage to transport the substrate to and from the antireflection film-forming modules;
(d) the second unit block includes: a transport passage extending linearly from the carrier block side to the interface block side; upper film forming modules disposed on both sides of the transport passage each for supplying a chemical liquid onto a resist film to form an upper film on the substrate; and a main transfer mechanism that moves along the transport passage to transport the substrate to and from the upper film-forming modules;
(e) one of the first and second unit blocks includes resist film-forming modules disposed on both sides of the transport passage of the first or second unit block each for supplying a chemical liquid, comprising a resist liquid, onto the antireflection film to form a resist film on the antireflection film;
(f) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;
(g) the heating processing block includes: a stack of heating modules including first heating modules assigned to the first and second unit blocks to heat a substrate after being supplied with the chemical liquid, and second heating modules assigned to said one or more the developing unit blocks to heat a substrate before being supplied with a developer; and a vertical transport mechanism for transporting a substrate among the heating modules;
(h) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block;
(i) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block;
(j) a transfer mechanism is provided to transfer a substrate, removed from a carrier placed in the carrier block, to the transfer stage on the carrier block side associated with the first unit block, and receive a substrate from the transfer stage on the carrier block side associated with the developing unit block; and
(k) the developing modules included in said one or more developing unit blocks include positive resist-developing modules for developing a positive resist and negative resist-developing modules for developing a negative resist.

8. The coating and developing apparatus according to claim 7, wherein, said coating and developing apparatus includes two developing unit blocks, one being a positive resist-developing unit block exclusively for developing a positive resist and having the positive resist-developing modules disposed on both sides of the associated transport passage, and the other being a negative resist-developing unit block exclusively for developing a negative resist having the negative resist-developing modules disposed on both sides of the associated transport passage.

9. The coating and developing apparatus according to claim 7, wherein, each of said one or more developing unit blocks includes at least two positive resist-developing modules and at least two negative resist-developing modules.

10. The coating and developing apparatus according to claim 9, wherein, in each of said one or more developing unit blocks, the two positive resist-developing modules are arranged on both sides of the transfer passage, and the two negative resist-developing modules are arranged on both sides of the transfer passage.

11. The coating and developing apparatus according to claim 9, wherein, in each of said one or more developing unit blocks, the two positive resist-developing modules are arranged side by side on one side of the transfer passage, and the two negative resist-developing modules are arranged side by side on another side of the transfer passage.

12. A coating and developing apparatus comprising a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block,
wherein:
(a) the processing block includes a liquid processing block disposed on a carrier block side and a heating processing block disposed on an interface block side, the liquid processing block comprising a stack of a liquid processing unit blocks;
(b) the liquid processing unit blocks include a stack of film-forming unit blocks comprising an antireflection film-forming unit block for forming an antireflection film on a substrate, a resist film-forming unit block for forming a resist film on the antireflection film and an upper film-forming unit block for forming an upper film on the resist film, which are stacked from bottom up in that order; and the liquid processing unit blocks further includes one or more developing unit blocks, for developing an exposed substrate, overlying or underlying a stack of the film-forming unit blocks;
(c) each of the liquid processing unit blocks includes: a transport passage extending linearly from the carrier block side to the interface block side; liquid processing modules disposed on both sides of the transport passage for supplying a chemical liquid onto the substrate to form thereon the antireflection film, the resist film or the upper film; a main transfer mechanism that moves along the transport passage to transport the substrate to and from the liquid processing modules;
(d) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;
(e) the heating processing block includes: a stack of heating modules including first heating modules assigned to the film forming unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules;
(f) a transfer stage is provided on the interface block side of each of the film forming unit blocks for transferring a substrate coated with the chemical liquid in the film-forming unit block from the main transfer mechanism of the film-forming unit block to the vertical transport mechanism; and a transfer stage is provided on the interface block side of the developing unit block for transferring an exposed substrate from the vertical transport mechanism to the main transfer mechanism of the developing unit block;
(g) a transfer stage is provided on the carrier block side of each of said one or more developing unit blocks for receiving a developed substrate from the main transfer mechanism of the developing unit block; a transfer stage is provided on the carrier block side of the antireflection film-forming unit block for transferring a substrate, removed from the carrier, to the main transfer mechanism of the antireflection film-forming unit block;
(h) a transfer mechanism is provided to transfer a substrate, removed from a carrier placed in the carrier block, to the transfer stage on the carrier block side associated with the antireflection film-forming unit block, and receive a substrate from the transfer stage on the carrier block side associated with said one or more developing unit blocks; and
(i) said coating and developing apparatus further includes one of the following configurations (i-1), (i-2) and (i-3):
(i-1) said coating and developing apparatus includes hardening modules to harden a resist pattern; all the developing modules included in said coating and developing apparatus are positive resist developing modules for developing a positive resist; the hardening modules are provided in one of the liquid processing unit blocks other than said one or more developing unit blocks; and the hardening modules are disposed on both sides of the transport passage of said one liquid processing unit;
(i-2) said coating and developing apparatus includes hardening modules to harden a resist pattern; the hardening modules are provided in one of the liquid processing unit blocks other than said one or more developing unit blocks; and the developing modules included in said one or more developing unit blocks include positive resist-developing modules for developing a positive resist, and negative resist-developing modules for developing a negative resist; and
(i-3) said coating and developing apparatus fails to include hardening modules; the developing modules include negative resist developing modules for developing a negative resist.

13. The coating and developing apparatus according to claim 12, wherein said coating and developing apparatus includes the configuration (i-2), and wherein said coating and developing apparatus includes two developing unit blocks, one being a positive resist-developing unit block exclusively for developing a positive resist and having the positive resist-developing modules disposed on both sides of the associated transport passage, and the other being a negative resist-developing unit block exclusively for developing a negative resist having the negative resist-developing modules disposed on both sides of the associated transport passage.

14. The coating and developing apparatus according to claim 12, wherein said coating and developing apparatus includes the configuration (i-2), and wherein each of said one or more developing unit blocks includes at least two positive resist-developing modules and at least two negative resist-developing modules.

15. The coating and developing apparatus according to claim 14, wherein, in each of said one or more developing unit blocks, the two positive resist-developing modules are arranged on both sides of the transfer passage, and the two negative resist-developing modules are arranged on both sides of the transfer passage.

16. The coating and developing apparatus according to claim 14, wherein, in each of said one or more developing unit blocks, the two positive resist-developing modules are arranged side by side on one side of the transfer passage, and the two negative resist-developing modules are arranged side by side on another side of the transfer passage.

17. The coating and developing apparatus according to claim 12, wherein said coating and developing apparatus includes the configuration (i-2), and a mode selection unit for selecting one of modes including: a first mode in which, after formation of a first resist pattern on the substrate, the first resist is hardened by using the hardening module, and thereafter a second resist pattern is formed on the substrate; and a second mode, in which a resist pattern is formed by using the negative resist-developing module.

18. A coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein:
(a) the processing block includes a liquid processing block disposed on a carrier block side and a heating processing block disposed on an interface block side, the liquid processing block comprising a stack of a liquid processing unit blocks;
(b) the liquid processing unit blocks includes a first unit block, a second unit block and one or more of developing unit blocks; said one or more developing unit blocks overlying or underlying a stack of the first unit block and the second unit block, the second unit block overlying the first unit block;
(c, d) said coating and developing apparatus has one of a combination of the features (c1) and (d1) or a combination of the features (c2) and (d2):
(c1) the first unit block includes: a transport passage extending linearly from the carrier block side to the interface block side; antireflection film-forming modules disposed on both sides of the transport passage each for supplying a chemical liquid onto the substrate to form thereon an antireflection film; resist film-forming modules disposed on both sides of the transport passage each for supplying a chemical liquid, comprising a resist liquid, onto the antireflection film to form a resist film on the antireflection film; a main transfer mechanism that moves along the transport passage to transport the substrate to and from the antireflection film-forming modules and the resist film-forming modules;
(d1) the second unit block includes: a transport passage extending linearly from the carrier block side to the interface block side; upper film-forming modules disposed on both sides of the transport passage each for supplying a chemical liquid onto the resist film to form an upper film on the substrate; hardening modules disposed on both sides of the transport passage each for supplying a hardening liquid onto a patterned resist film, having been exposed and developed, to harden the patterned resist film; and a main transfer mechanism that moves along the transport passage to transport the substrate to and from the upper film-forming modules and the hardening modules;
(c2) the first unit block includes: a transport passage extending linearly from the carrier block side to the interface block side; antireflection film-forming modules disposed on both sides of the transport passage each for supplying a chemical liquid onto the substrate to form thereon an antireflection film; hardening modules disposed on both sides of the transport passage each for supplying a hardening liquid onto a patterned resist film, having been exposed and developed, to harden the patterned resist film; a main transfer mechanism that moves along the transport passage to transport the substrate to and from the antireflection film-forming modules and the hardening modules;
(d2) the second unit block includes: a transport passage extending linearly from the carrier block side to the interface block side; upper film-forming modules disposed on both sides of the transport passage each for supplying a chemical liquid onto the resist film to form an upper film on the substrate; resist film-forming modules disposed on both sides of the transport passage each for supplying a chemical liquid, comprising a resist liquid, onto the antireflection film to form a resist film on the antireflection film; and a main transfer mechanism that moves along the transport passage to transport the substrate to and from the upper film-forming modules and the resist film-forming modules;
(e) each of said one or more developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;
(f) the heating processing block includes: a stack of heating modules including first heating modules assigned to the first and second unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules;
(g) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the, chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block;

(h) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block; and (i) a transfer mechanism is provided to transfer a substrate, removed from a carrier placed in the carrier block, to the transfer stage on the carrier block side associated with the first unit block, and receive a substrate from the transfer stage on the carrier block side associated with each of said one or more developing unit blocks, said coating and developing method comprising:
supplying a resist liquid to a substrate to form a first resist film;
thereafter developing the substrate to provide a first pattern to the first resist film;
thereafter supplying a hardening liquid to the first resist film having the first pattern to harden it;
thereafter supplying a resist liquid to a substrate to form a second resist film on the first resist film having the first pattern; and
thereafter developing the substrate to provide a second pattern to the second resist film.

19. A non-transitory storage medium storing a computer program for use in a coating and developing apparatus, wherein the computer program is configured to perform the coating and developing method according to claim 18.

20. A coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein:
(a) the processing block includes a liquid processing block disposed on a carrier block side and a heating processing block disposed on an interface block side, the liquid processing block comprising a stack of a liquid processing unit blocks;
(b) the liquid processing unit blocks includes a first unit block, a second unit block and one or more developing unit blocks, said one or more developing unit blocks overlying or underlying a stack of the first unit block and the second unit block, the second unit block overlying the first unit block;
(c) the first unit block includes: a transport passage extending linearly from the carrier block side to the interface block side; antireflection film-forming modules disposed on both sides of the transport passage each for supplying a chemical liquid onto the substrate to form thereon an antireflection film; and a main transfer mechanism that moves along the transport passage to transport the substrate to and from the antireflection film-forming modules;

(d) the second unit block includes: a transport passage extending linearly from the carrier block side to the interface block side; upper film forming modules disposed on both sides of the transport passage each for supplying a chemical liquid onto a resist film to form an upper film on the substrate; and a main transfer mechanism that moves along the transport passage to transport the substrate to and from the upper film-forming modules;

(e) one of the first and second unit blocks includes resist film-forming modules disposed on both sides of the transport passage of the first or second unit block each for supplying a chemical liquid, comprising a resist liquid, onto the antireflection film to form a resist film on the antireflection film;

(f) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;

(g) the heating processing block includes: a stack of heating modules including first heating modules assigned to the first and second unit blocks to heat a substrate after being supplied with the, chemical liquid, and second heating modules assigned to said one or more the developing unit blocks to heat a substrate before being supplied with a developer; and a vertical transport mechanism for transporting a substrate among the heating modules;

(h) a transfer stage is provided on the interface block side of the first unit block for transferring a substrate coated with the chemical liquid in the first unit block from the main transfer mechanism of the first unit block to the vertical transport mechanism; a transfer stage is provided on the interface block side of the second unit block for transferring a substrate coated with the chemical liquid in the second unit block from the main transfer mechanism of the second unit block to the vertical transport mechanism; and a transfer stage is provided on the interface block side of each of said one or more developing unit blocks for transferring an exposed substrate from the vertical transport mechanism to the main transfer mechanism of the developing unit block;

(i) a transfer stage is provided on the carrier block side of each of said one or more developing unit blocks for receiving a developed substrate from the main transfer mechanism of the developing unit block; a transfer stage is provided on the carrier block side of the first unit block for transferring a substrate, removed from the carrier, to the main transfer mechanism of the first unit block;

(j) a transfer mechanism is provided to transfer a substrate, removed from a carrier placed in the carrier block, to the transfer stage on the carrier block side associated with the first unit block, and receive a substrate from the transfer stage on the carrier block side associated with the developing unit block; and (k) the developing modules included in said one or more developing unit blocks include positive resist-developing modules for developing a positive resist and negative resist-developing modules for developing a negative resist;

said coating and developing method comprising:
applying a positive resist or a negative resist on a substrate by using one of the resist film-forming modules; and transporting the substrate to one of the positive resist-developing modules if the positive resist is applied to the substrate, or to one of the negative resist-developing modules if the negative resist is applied to the substrate.

21. A coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein:
(a) the processing block includes a liquid processing block disposed on a carrier block side and a heating processing block disposed on an interface block side, the liquid processing block comprising a stack of a liquid processing unit blocks;
(b) the liquid processing unit blocks include a stack of film-forming unit blocks comprising an antireflection film-forming unit block for forming an antireflection film on a substrate, a resist film-forming unit block for forming a resist film on the antireflection film and an upper film-forming unit block for forming an upper film on the resist film, which are stacked from bottom up in that order; and the liquid processing unit blocks further includes one or more developing unit blocks, for developing an exposed substrate, overlying or underlying a stack of the film-forming unit blocks;
(c) each of the liquid processing unit blocks includes: a transport passage extending linearly from the carrier block side to the interface block side; liquid processing modules disposed on both sides of the transport passage for supplying a chemical liquid onto the substrate to form thereon the antireflection film, the resist film or the upper film; a main transfer mechanism that moves along the transport passage to transport the substrate to and from the liquid processing modules;
(d) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;
(e) the heating processing block includes: a stack of heating modules including first heating modules assigned to the film forming unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules;
(f) a transfer stage is provided on the interface block side of each of the film forming unit blocks for transferring a substrate coated with the chemical liquid in the film-forming unit block from the main transfer mechanism of the film-forming unit block to the vertical transport mechanism; and a transfer stage is provided on the interface block side of the developing unit block for transferring an exposed substrate from the vertical transport mechanism to the main transfer mechanism of the developing unit block;
(g) a transfer stage is provided on the carrier block side of each of said one or more developing unit blocks for receiving a developed substrate from the main transfer mechanism of the developing unit block; a transfer stage is provided on the carrier block side of the antireflection film-forming unit block for transferring a substrate, removed from the carrier, to the main transfer mechanism of the antireflection film-forming unit block;
(h) a transfer mechanism is provided to transfer a substrate, removed from a carrier placed in the carrier block, to the transfer stage on the carrier, block side associated with the antireflection film-forming unit block, and receive a substrate from the transfer stage on the carrier block side associated with said one or more developing unit blocks; and
(i) said coating and developing apparatus further includes one of the following configurations (i-1), (i-2) and (i-3):
(i-1) said coating and developing apparatus includes hardening modules to harden a resist pattern; all the developing modules included in said coating and developing apparatus are positive resist developing modules for developing a positive resist; the hardening modules are provided in one of the liquid processing unit blocks other than said one or more developing unit blocks; and the hardening modules are disposed on both sides of the transport passage of said one liquid processing unit;
(i-2) said coating and developing apparatus includes hardening modules to harden a resist pattern; the hardening modules are provided in one of the liquid processing unit blocks other than said one or more developing unit blocks; and the developing modules included in said one or more developing unit blocks include positive resist-developing modules for developing a positive resist and negative resist-developing modules for developing a negative resist;
(i-3) said coating and developing apparatus fails to include hardening modules; the developing modules include negative resist developing modules for developing a negative resist, said coating and developing method comprising:
applying a positive resist liquid to a substrate by using one of the resist film-forming modules to form a first resist film;
supplying a developer to the substrate by using one of the positive resist-developing modules to perform a first developing process to provide the first resist film with a first pattern;
supplying, by using one of the hardening modules, a hardening liquid to the first resist film having the first pattern to harden it;
applying a positive resist liquid to the hardened first resist film by using one of the resist film-forming modules; and
supplying a developer to the substrate by using one of the positive resist-developing modules to perform a second developing process to provide the second resist film with a second pattern.

22. A coating and developing method that employs a coating and developing apparatus including a carrier block, a processing block and an interface block arrayed in that order, the interface block connectable to an exposure apparatus, said coating and developing apparatus being configured to transfer a substrate from a carrier, which has been loaded into the carrier block, to the processing block, form coating films containing a resist film, deliver the substrate to the exposure apparatus via the interface block, develop the substrate, which has been exposed by the exposure apparatus and returned to the processing block via the interface block, in the processing block, and return the substrate into the carrier block, wherein:
- (a) the processing block includes a liquid processing block disposed on a carrier block side and a heating processing block disposed on an interface block side, the liquid processing block comprising a stack of a liquid processing unit blocks;
- (b) the liquid processing unit blocks include a stack of film-forming unit blocks comprising an antireflection film-forming unit block for forming an antireflection film on a substrate, a resist film-forming unit block for forming a resist film on the antireflection film and an upper film-forming unit block for forming an upper film on the resist film, which are stacked from bottom up in that order; and the liquid processing unit blocks further includes one or more developing unit blocks, for developing an exposed substrate, overlying or underlying a stack of the film-forming unit blocks;
- (c) each of the liquid processing unit blocks includes: a transport passage extending linearly from the carrier block side to the interface block side; liquid processing modules disposed on both sides of the transport passage for supplying a chemical liquid onto the substrate to form thereon the antireflection film, the resist film or the upper film; a main transfer mechanism that moves along the transport passage to transport the substrate to and from the liquid processing modules;
- (d) each of said one or more the developing unit blocks includes: a transport passage extending linearly from the carrier block side to the interface block side; developing modules disposed on both sides of the transport passage each for supplying developer to a substrate; and a main transfer mechanism that moves along the transport passage to transport the substrate to and from the developing modules;
- (e) the heating processing block includes: a stack of heating modules including first heating modules assigned to the film forming unit blocks to heat a substrate after being supplied with the chemical liquid, and second heating modules assigned to said one or more developing unit blocks to heat a substrate before being supplied with a developer; and a vertical transport mechanism for transporting a substrate to and from the heating modules;
- (f) a transfer stage is provided on the interface block side of each of the film forming unit blocks for transferring a substrate coated with the chemical liquid in the film-forming unit block from the main transfer mechanism of the film-forming unit block to the vertical transport mechanism; and a transfer stage is provided on the interface block side of the developing unit block for transferring an exposed substrate from the vertical transport mechanism to the main transfer mechanism of the developing unit block;
- (g) a transfer stage is provided on the carrier block side of each of said one or more developing unit blocks for receiving a developed substrate from the main transfer mechanism of the developing unit block; a transfer stage is provided on the carrier block side of the antireflection film-forming unit block for transferring a substrate, removed from the carrier, to the main transfer mechanism of the antireflection film-forming unit block;
- (h) a transfer mechanism is provided to transfer a substrate, removed from a carrier placed in the carrier block, to the transfer stage on the carrier block side associated with the antireflection film-forming unit block, and receive a substrate from the transfer stage on the carrier block side associated with said one or more developing unit blocks; and
- (i) said coating and developing apparatus further includes one of the following configurations (i-1), (i-2) and (i-3):
- (i-1) said coating and developing apparatus includes hardening modules to harden a resist pattern; all the developing modules included in said coating and developing apparatus are positive resist developing modules for developing a positive resist; the hardening modules are provided in one of the liquid processing unit blocks other than said one or more developing unit blocks; and the hardening modules are disposed on both sides of the transport passage of said one liquid processing unit;
- (i-2) said coating and developing apparatus includes hardening modules to harden a resist pattern; the hardening modules are provided in one of the liquid processing unit blocks other than said one or more developing unit blocks; and the developing modules included in said one or more developing unit blocks include positive resist-developing modules for developing a positive resist and negative resist-developing modules for developing a negative resist;
- (i-3) said coating and developing apparatus fails to include hardening modules; the developing modules include negative resist developing modules for developing a negative resist, said coating and developing method comprising:

applying a negative resist liquid to a first substrate by using one of the resist film-forming modules to form a first positive-type resist film;

supplying a developer to the first substrate by using one of the negative resist-developing modules to provide the first positive-type resist film with a first pattern.

23. The coating and developing method according to claim 22, further comprising:

applying a positive resist liquid to a second substrate by using one of the resist film-forming modules to form a first positive-type resist film;

supplying a developer to the second substrate to provide the first positive-type resist film with a first pattern;

supplying a hardening liquid to the first positive-type resist film to harden it;

applying a positive resist liquid onto the hardened first positive-type resist film by using one of the resist film-forming modules to form a second positive-type resist film; and supplying a developer to the second substrate by using one of the positive-resist developing modules to provide the second positive-type resist film with a second pattern.

* * * * *